United States Patent
Ogihara et al.

(10) Patent No.: US 11,555,697 B2
(45) Date of Patent: Jan. 17, 2023

(54) METHOD FOR MEASURING DISTANCE OF DIFFUSION OF CURING CATALYST

(71) Applicant: SHIN-ETSU CHEMICAL CO., LTD., Tokyo (JP)

(72) Inventors: Tsutomu Ogihara, Joetsu (JP); Tsukasa Watanabe, Joetsu (JP); Yoshio Kawai, Joetsu (JP); Tomohiro Kobayashi, Joetsu (JP); Yusuke Biyajima, Joetsu (JP); Masahiro Kanayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 402 days.

(21) Appl. No.: 16/808,637

(22) Filed: Mar. 4, 2020

(65) Prior Publication Data
US 2020/0340806 A1 Oct. 29, 2020

(30) Foreign Application Priority Data
Apr. 26, 2019 (JP) .............................. JP2019-086505

(51) Int. Cl.
| | |
|---|---|
| *G01B 15/02* | (2006.01) |
| *C08G 77/08* | (2006.01) |
| *G03F 7/004* | (2006.01) |
| *G03F 7/075* | (2006.01) |
| *G03F 7/11* | (2006.01) |
| *G03F 7/20* | (2006.01) |
| *G03F 7/32* | (2006.01) |

(52) U.S. Cl.
CPC .............. *G01B 15/02* (2013.01); *C08G 77/08* (2013.01); *G03F 7/0045* (2013.01); *G03F 7/0752* (2013.01); *G03F 7/11* (2013.01); *G03F 7/2059* (2013.01); *G03F 7/322* (2013.01)

(58) Field of Classification Search
None
See application file for complete search history.

(56) References Cited

U.S. PATENT DOCUMENTS

| | | | |
|---|---|---|---|
| 6,268,457 | B1 | 7/2001 | Kennedy et al. |
| 10,114,288 | B2 | 10/2018 | Cutler et al. |
| 2002/0001768 | A1 | 1/2002 | Feke et al. |
| 2007/0238300 | A1 | 10/2007 | Ogihara et al. |
| 2008/0026322 | A1 | 1/2008 | Ogihara et al. |
| 2009/0050020 | A1 | 2/2009 | Konno et al. |
| 2009/0136869 | A1 | 5/2009 | Ogihara et al. |
| 2010/0086870 | A1 | 4/2010 | Ogihara et al. |
| 2010/0261097 | A1 | 10/2010 | Sun |
| 2010/0285407 | A1 | 11/2010 | Ogihara et al. |
| 2012/0052685 | A1 | 3/2012 | Ogihara et al. |
| 2012/0177891 | A1 | 7/2012 | Millward et al. |
| 2012/0238095 | A1 | 9/2012 | Ogihara et al. |
| 2013/0005150 | A1 | 1/2013 | Ogihara et al. |
| 2013/0210236 | A1 | 8/2013 | Ogihara et al. |
| 2013/0280912 | A1 | 10/2013 | Ogihara et al. |
| 2014/0205951 | A1 | 7/2014 | Ogihara et al. |
| 2014/0232018 | A1 | 8/2014 | Shigaki et al. |
| 2014/0235796 | A1* | 8/2014 | Ogihara ............... C09D 183/08 528/38 |
| 2015/0048046 | A1 | 2/2015 | Dei et al. |
| 2015/0079792 | A1 | 3/2015 | Shigaki et al. |
| 2015/0210829 | A1 | 7/2015 | Shibayama et al. |
| 2015/0316849 | A1 | 11/2015 | Kanno et al. |
| 2015/0357204 | A1 | 12/2015 | Ogihara et al. |
| 2017/0322491 | A1 | 11/2017 | Shibayama et al. |

FOREIGN PATENT DOCUMENTS

| | | |
|---|---|---|
| JP | 2001-022083 A | 1/2001 |
| JP | 2003-531401 A | 10/2003 |
| JP | 2004-157469 A | 6/2004 |
| JP | 2004-191386 A | 7/2004 |
| JP | 2005-509914 A | 4/2005 |
| JP | 2007-302873 A | 11/2007 |
| JP | 2008-019423 A | 1/2008 |
| JP | 2009-126940 A | 6/2009 |
| JP | 2010-085912 A | 4/2010 |
| JP | 2010-262230 A | 11/2010 |
| JP | 2012-053253 A | 3/2012 |
| JP | 2012-194216 A | 10/2012 |
| JP | 2013-033187 A | 2/2013 |
| JP | 2013-167669 A | 8/2013 |
| JP | 2013-224279 A | 10/2013 |

(Continued)

OTHER PUBLICATIONS

Jan. 25, 2022 Office Action issued in Korean Patent Application No. 10-2020-0050120.
Oct. 14, 2020 Extended European Search Report issued in European Patent Application No. 20166907.4.
Hutchinson, John M. "The Shot Noise Impact on Resist Roughness in EUV Lithography". SPIE, vol. 3331, pp. 531-536.

* cited by examiner

*Primary Examiner* — Anca Eoff
(74) *Attorney, Agent, or Firm* — Oliff PLC

(57) ABSTRACT

A method for measuring a distance of diffusion of a curing catalyst for a thermosetting silicon-containing material includes the steps of: forming a silicon-containing film from a composition containing a thermosetting silicon-containing material, a curing catalyst and a solvent; coating the silicon-containing film with a photosensitive resin composition containing a resin whose solubility in alkaline developer is increased by the action of an acid, an acid generator and a solvent, and subsequently heating to prepare a substrate on which the silicon-containing film and a resin film are formed; irradiating the substrate with a high energy beam or an electron beam to generate an acid and heat-treating the substrate to increase the solubility of the resin in an alkaline developer by the action of the acid in the resin film; dissolving the resin film in an alkaline developer; and measuring a film thickness of the remaining resin.

4 Claims, 1 Drawing Sheet

(56) References Cited

FOREIGN PATENT DOCUMENTS

| | | |
|---|---|---|
| JP | 2014-141585 A | 8/2014 |
| JP | 2015-229640 A | 12/2015 |
| JP | 2017-083849 A | 5/2017 |
| KR | 101225248 B1 | 1/2013 |
| KR | 10-2013-0035224 A | 4/2013 |
| KR | 10-2013-0093549 A | 8/2013 |
| WO | 2006/093057 A1 | 9/2006 |
| WO | 2009/110603 A1 | 9/2009 |
| WO | 2013/051558 A1 | 4/2013 |
| WO | 2013/161372 A1 | 10/2013 |
| WO | 2014/021256 A1 | 2/2014 |
| WO | 2014/069329 A1 | 5/2014 |

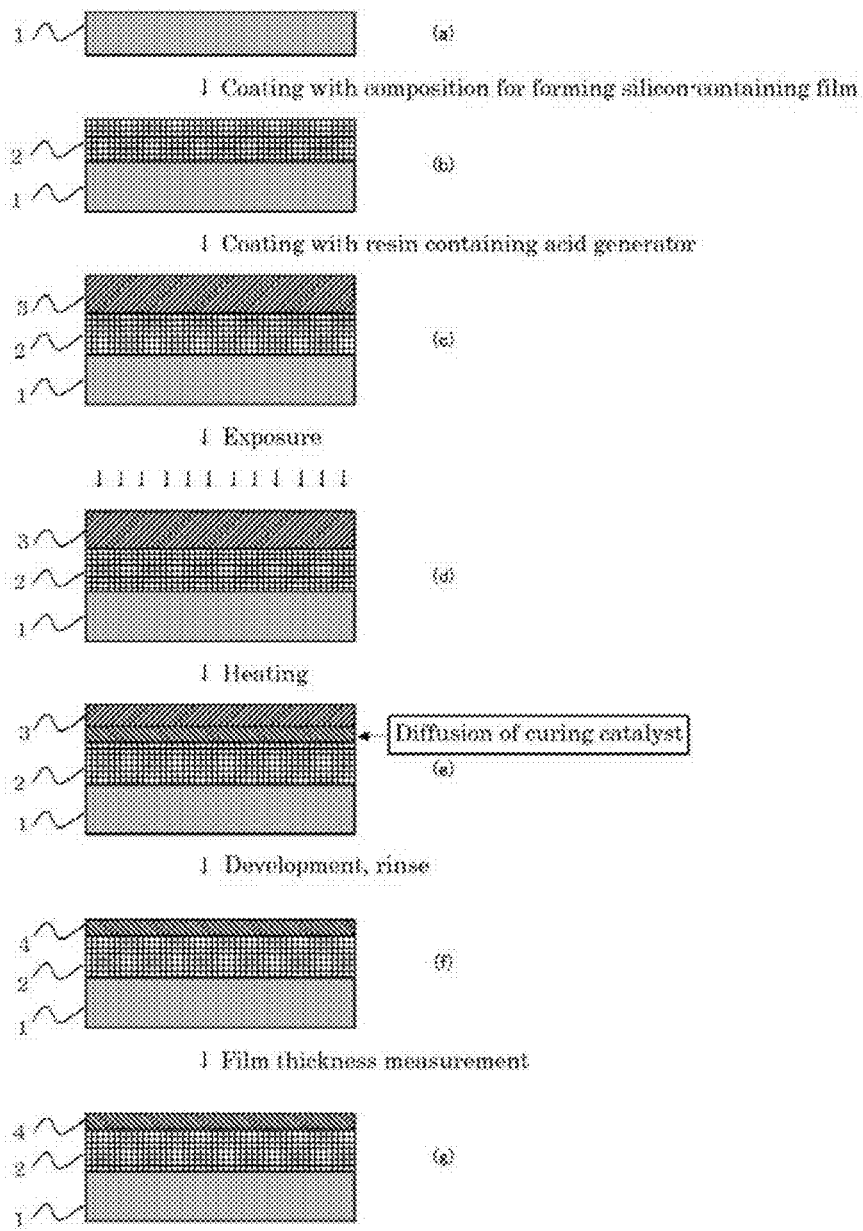

METHOD FOR MEASURING DISTANCE OF DIFFUSION OF CURING CATALYST

CROSS-REFERENCE TO RELATED APPLICATIONS

This application claims priority to Japanese Patent Application No. 2019-86505, filed Apr. 26, 2019. The disclosure of the prior application is hereby incorporated by reference herein in its entirety.

TECHNICAL FIELD

The present invention relates to a method for measuring a distance of diffusion of a curing catalyst (Xc) used when curing a thermosetting silicon-containing material (Sx) to form a silicon-containing film (Sf).

BACKGROUND ART

As LSIs advance toward higher integration and higher processing speed, miniaturization of pattern rule is progressing rapidly. Particularly, logic devices used in smartphones and so forth lead this miniaturization, and 10 nm-node logic devices are mass-produced by employing a multiple-exposure process with ArF lithography (multiple patterning lithography).

The lithography for the next 7 nm-node or 5 nm-node appears to have problems that the multiple exposures increase the cost and affect the superposition precision. Hence, the advent of EUV lithography which requires fewer exposures has been sought.

The wavelength of an extreme ultraviolet (EUV), which is 13.5 nm, is ¹⁄₁₀ or shorter than that of an ArF excimer laser, which is 193 nm. Thus, high contrast light and high resolution are expected from EUV lithography. On the other hand, since EUV has short wavelength and high energy density, an acid generator is sensitized with a small amount of the photons. The number of the photons in EUV exposure is said to be ¹⁄₁₄ of that of ArF exposure. Thus, phenomena in which variations of the photons degrade line edge roughness (LWR) and hole critical dimension uniformity (CDU) are considered as a problem (Non Patent Document 1). Further, it is also pointed out that these properties are possibly influenced by the localization and agglomeration of a base polymer and an acid generator as well as the diffusion of acids generated from an acid generator. Regarding such a diffusion situation of acids in a resist generated in exposure, for example, a method of using a fluorescent material with a pH dependence in the resist for observation is suggested (Patent Document 1).

On the other hand, to prevent pattern collapse during development, a pattern formed by ArF lithography has a thinned resist film thickness. Therefore, with a resist pattern having such a film thickness, a problem occurs that dry etching selectivity for transferring the pattern to the substrate by dry etching cannot be ensured. Accordingly, a pattern-transferring process using a multilayer resist method in which a silicon-containing film is used as a resist underlayer film is generally applied. It is known that the silicon-containing film used in this case is to be formed from a composition for forming a silicon-containing resist underlayer film containing a curing catalyst (Patent Document 2).

ArF lithography and the multilayer resist method are also applied in EUV lithography, in which finer patterns can be formed, and the application of a curing catalyst in the composition for forming a silicon-containing resist underlayer film used in this case has also been suggested (Patent Document 3). This curing catalyst has a suitable structure for the formation of a siloxane bond through condensation of silanol, and has a structure similar to that of a sensitivity modifier in a resist upper layer film. Therefore, when the curing catalyst is diffused to the resist upper layer film at the time of exposure or after the exposure, pattern formability in the interface between the resist upper layer film and the silicon-containing underlayer film may be affected. In EUV lithography, in which a formed pattern line width is thinner than in ArF lithography, in particular, the properties of LWR and CDU are likely to be affected. Accordingly, to evaluate the actual effect, it is necessary to observe the movement of such a low molecular component. As such a method, a method of using a compound that generates fluorescence to observe the diffusion of a low molecular component in a cured film is suggested (Patent Document 4).

CITATION LIST

Patent Literature

Patent Document 1: JP 2003-531401 A
Patent Document 2: JP 2007-302873 A
Patent Document 3: WO 2013/161372 A1
Patent Document 4: WO 2009/110603 A1

Non Patent Literature

Non Patent Document 1: SPIE, Vol. 3331, p 531 (1998)

SUMMARY OF INVENTION

Technical Problem

The present invention has been made in view of the above-described problem. An object of the present invention is to provide, in order to find a curing catalyst which has sufficient formability of a silicon-containing film while not affecting a pattern profile of a resist upper layer film, a method for measuring a distance of diffusion of the curing catalyst itself from the silicon-containing film to the resist upper layer film to be formed on the silicon-containing film.

Solution to Problem

To achieve the object, the present invention provides a method for measuring a distance of diffusion of a curing catalyst (Xc) for a thermosetting silicon-containing material (Sx), comprising the steps of:

(1) coating a substrate with a composition for forming a silicon-containing film containing the thermosetting silicon-containing material (Sx), the curing catalyst (Xc), and a solvent (a), and subsequently heating to form a silicon-containing film (Sf), (2) coating the silicon-containing film (Sf) with a photosensitive resin composition containing a resin (A), an acid generator and a solvent (b), and subsequently heating to remove the solvent (b) to prepare a substrate on which the silicon-containing film (Sf) and a resin film are formed, a solubility of the resin (A) in an alkaline developer being increased by an action of an acid, and the acid generator being to generate an acid by a high energy beam having a wavelength of 300 nm or less or an electron beam, (3) irradiating the substrate with the high energy beam or the electron beam to decompose the acid generator so as to generate an acid, (4) heat-treating the substrate to increase the solubility of the resin (A) in an alkaline developer by the action of the acid in the resin film, (5) dissolving in an alkaline developer the resin film having the increased solubility in the alkaline developer, and (6) measuring a film thickness of the resin (A) that was not dissolved in the alkaline developer and remained on the silicon-containing film (Sf).

In the method for measuring a distance of diffusion of a curing catalyst (Xc) for a thermosetting silicon-containing material (Sx), the curing catalyst (Xc) in the silicon-containing film (Sf) diffuses to the resin (A), neutralizing, near the silicon-containing film (Sf), the acid in the resin (A) generated due to light irradiation. Thus, change in the solubility of the resin (A) in alkaline developer does not occur near the silicon-containing film (Sf), and the resin (A) remains on the silicon-containing film (Sf). This simulatively reproduces a state that occurs near a resist pattern and the silicon-containing film (Sf) in photolithography, and particularly in EUV lithography, it is possible to select a curing catalyst that does not affect LWR or CDU without using an expensive exposure apparatus by substituting with a comparatively low-cost KrF exposure apparatus or high-pressure mercury lamp and the like.

The silicon-containing film (Sf) is preferably formed by the thermosetting silicon-containing material (Sx) newly forming a siloxane bond by the curing catalyst (Xc).

When, as the curing catalyst (Xc), a curing catalyst which newly forms a siloxane bond is used, it is possible to provide a method for measuring the distance of diffusion of the curing catalyst (Xc) effective for a curing reaction to newly form a siloxane bond by a dehydration-condensation or a dealcoholization-condensation of a silanol group or an alkoxysilyl group.

A curing catalyst containing nitrogen, sulfur, phosphorus or iodine is preferably used as the curing catalyst (Xc).

When, as the curing catalyst (Xc), the specific kind described above is used, it is possible to provide a method for measuring the distance of diffusion of a curing catalyst (Xc) containing nitrogen, sulphur, phosphorus or iodine.

An onium compound is preferably used as the curing catalyst (Xc).

When an onium compound is used as the curing catalyst (Xc), it is possible to provide a method for measuring the distance of diffusion of an ammonium compound, a cyclic ammonium compound, a cyclic amine compound, a sulfonium compound, a phosphonium compound, and an iodonium compound as the curing catalyst (Xc).

Advantageous Effects of Invention

As described above, the inventive method for measuring a distance of diffusion of a curing catalyst (Xc) for a thermosetting silicon-containing material (Sx) makes it possible to reproduce the situation near a resist upper layer film and a silicon-containing film (Sf) due to the diffusion of the curing catalyst (Xc) from the silicon-containing film (Sf) without using an expensive EUV exposure apparatus, and this enables the selection of a curing catalyst (Xc) that does not affect LWR or CDU in EUV lithography.

BRIEF DESCRIPTION OF DRAWINGS

FIG. 1 is a schematic diagram showing an example of the inventive method for measuring a distance of diffusion of a curing catalyst (Xc) for a thermosetting silicon-containing material (Sx).

DESCRIPTION OF EMBODIMENTS

As described above, development of a method for measuring a distance of diffusion of the curing catalyst (Xc) from the silicon-containing film (Sf) to the resist upper layer film to be formed on the silicon-containing film (Sf) has been required.

The present inventors have earnestly studied the above problem, and found a method for measuring the distance that the curing catalyst (Xc), which may affect LWR or CDU in EUV lithography, in the silicon-containing film (Sf) which is a silicon-containing resist underlayer film disperses to a resist upper layer film to be formed on the silicon-containing film (Sf) simply and without using an expensive EUV exposure apparatus, and completed the present invention.

That is, the present invention is a method for measuring a distance of diffusion of a curing catalyst (Xc) for a thermosetting silicon-containing material (Sx), comprising the steps of:

(1) coating a substrate with a composition for forming a silicon-containing film containing the thermosetting silicon-containing material (Sx), the curing catalyst (Xc), and a solvent (a), and subsequently heating to form a silicon-containing film (Sf), (2) coating the silicon-containing film (Sf) with a photosensitive resin composition containing a resin (A), an acid generator and a solvent (b), and subsequently heating to remove the solvent (b) to prepare a substrate on which the silicon-containing film (Sf) and a resin film are formed, a solubility of the resin (A) in an alkaline developer being increased by an action of an acid, and the acid generator being to generate an acid by a high energy beam having a wavelength of 300 nm or less or an electron beam, (3) irradiating the substrate with the high energy beam or the electron beam to decompose the acid generator so as to generate an acid, (4) heat-treating the substrate to increase the solubility of the resin (A) in an alkaline developer by the action of the acid in the resin film, (5) dissolving in an alkaline developer the resin film having the increased solubility in the alkaline developer, and (6) measuring a film thickness of the resin (A) that was not dissolved in the alkaline developer and remained on the silicon-containing film (Sf).

Hereinafter, the present invention will be described in detail, but the present invention is not limited thereto.

Method for Measuring Distance of Diffusion of Curing Catalyst (Xc)

Hereinafter, the present invention will be described with reference to FIG. 1.

FIG. 1 is a flow diagram which shows, for measuring the distance of diffusion of the curing catalyst (Xc) for a thermosetting silicon-containing material (Sx) in the present invention, the process of the curing catalyst (Xc) diffusing from the silicon-containing film (Sf). Firstly, a composition for forming a silicon-containing film containing a thermosetting silicon-containing material (Sx), a curing catalyst (Xc), and a solvent (a) is spin-coated on a substrate 1 and heat-treated to form a silicon-containing film 2 (FIG. 1(b)). The reason for heating and curing the composition for forming a silicon-containing film is to avoid intermixing with the resist upper layer film 3 which is a resin film to be formed on the film. In this curing, preferably, dehydration reaction and/or dealcoholization reaction of a silanol group and an alkoxysilyl group of the thermosetting silicon-containing material (Sx) contained in the composition for forming a silicon-containing film occur, and a siloxane bond is newly formed. The curing catalyst (Xc) is added in order to promote this reaction. In this way, curing of the silicon-containing film 2 progresses sufficiently, and it is possible to obtain a silicon-containing film 2 insolubilized to a solvent (a). On the cured silicon-containing film 2, a composition containing a resin (A) used in what is called a photosensitive resin composition, for example a resin in which a functional group giving alkali-solubility to an alkali-soluble resin which has a hydroxyl group or a carboxyl group as a partial structure is protected by an acid-leaving group, an acid generator which generates acid by a high energy beam having a wavelength of 300 nm or less or an electron beam, and a solvent (b) is spin-coated and heated to form a resist upper layer film 3 which is a resin film. The heating temperature in this procedure is sufficient if the solvent (b) in the photosensitive resin composition evaporates, and the temperature is preferably 50° C. or more and 300° C. or less, more preferably 70° C. or more and 200° C. or less (FIG. 1(c)). Subsequently, a high energy beam having a wavelength of 300 nm or less or an electron beam is irradiated in order to decompose the acid generator. For the high energy beam, high-pressure mercury lamp, KrF excimer laser, ArF excimer laser, or some other appropriate light source or energy beam source is selected to generate an acid. The irradiation quantity of the high energy beam or the electron beam is preferably 1 mJ or more and 1000 mJ or less, more preferably 5 mJ or more and 100 mJ or less (FIG. 1(d)). Next, heat treatment is performed to eliminate the protective group of the alkali-soluble functional group so that the alkali solubility of the resin (A) is exhibited. The heat treatment temperature is preferably 50° C. or more and 250° C. or less, more preferably 70° C. or more and 200° C. or less. In this procedure, when the curing catalyst (Xc) is diffused from the silicon-containing film 2, the generated acid is neutralized by the curing catalyst (Xc) and a portion where the alkali-solubility of the resin (A) is inhibited appears near the silicon-containing film 2 (FIG. 1(e)). When this is developed by an alkaline developer, a part where the protective group was eliminated dissolves in the alkaline developer, and in a region near the silicon-containing film 2, a resist upper layer film 4, which is a resin film, remains depending on the distance of diffusion of the curing catalyst (Xc) (FIG. 1(f)). The film thickness of the remaining resist upper layer film 4 measured by a film thickness meter can be seen as the distance of diffusion of the curing catalyst (Xc) contained in the silicon-containing film 2.

Thermosetting Silicon-Containing Material (Sx)

For the thermosetting silicon-containing material (Sx) used in the present invention, a conventionally known material can be used. For example, examples of the material include those described in JP 2001-22083 A, JP 2004-157469 A, JP 2004-191386 A, JP 2005-509914 A, WO 2006/93057 A1, JP 2007-302873 A, JP 2008-19423 A, JP 2009-126940 A, JP 2010-85912 A, JP 2010-262230 A, JP 2012-53253 A, JP 2012-194216 A, JP 2013-33187 A, JP 2013-167669 A, JP 2013-224279 A, WO 2013/51558 A1, WO 2013/161372 A1, WO 2014/21256 A1, WO 2014/69329 A1, JP 2017-83849 A and the like.

The thermosetting silicon-containing material (Sx) in the present invention may be a thermosetting polysiloxane containing one or more of a repeating unit represented by the following general formula (Sx-1), a repeating unit represented by the following general formula (Sx-2), and a partial structure represented by the following general formula (Sx-3):

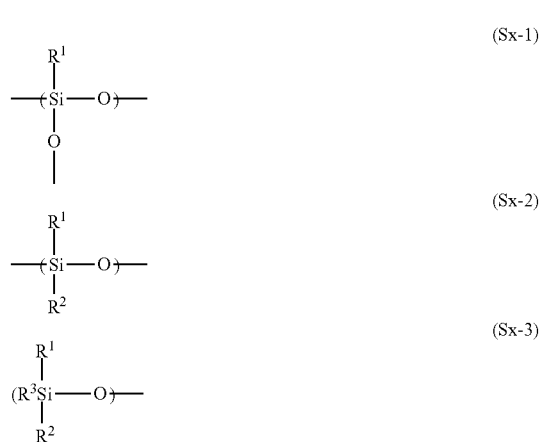

wherein, in the formulae, $R^1$, $R^2$, and $R^3$ are each a monovalent organic group which may be identical to or different from each other and having 1 to 30 carbon atoms.

The thermosetting silicon-containing material (Sx) can be produced by hydrolysis condensation of the following hydrolysable monomer (Sm).

Specifically, Examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the compound include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the organic group shown by $R^1$, $R^2$, and $R^3$ include organic groups having one or more carbon-oxygen single bonds or carbon-oxygen double bonds, specifically organic groups having one or more groups selected from the group consisting of an ether bond, an ester bond, alkoxy groups, and a hydroxy group and the like. Examples of the organic groups include ones shown by the following general formula (Sm-R).

$$(P-Q_1-(S_1)_{v1}-Q_2-)_u-(T)_{v2}-Q_3-(S_2)_{v3}-Q_4-) \quad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $-C_qH_{(2q-p)}P_p-$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent $-O-$, $-CO-$, $-OCO-$, $-COO-$, or $-OCOO-$. v1, v2, and v3 each independently represent 0 or 1. In addition to these, T represents a divalent atom other than carbon, or a divalent group of an alicyclic, aromatic, or heterocyclic ring. As T, examples of the alicyclic, aromatic, or heterocyclic ring optionally containing a hetero atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

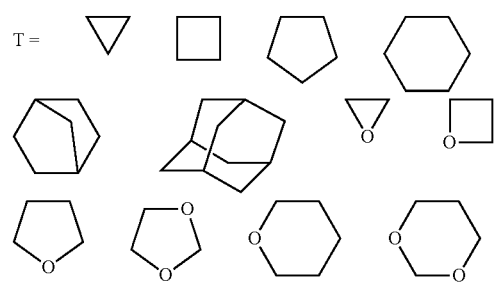

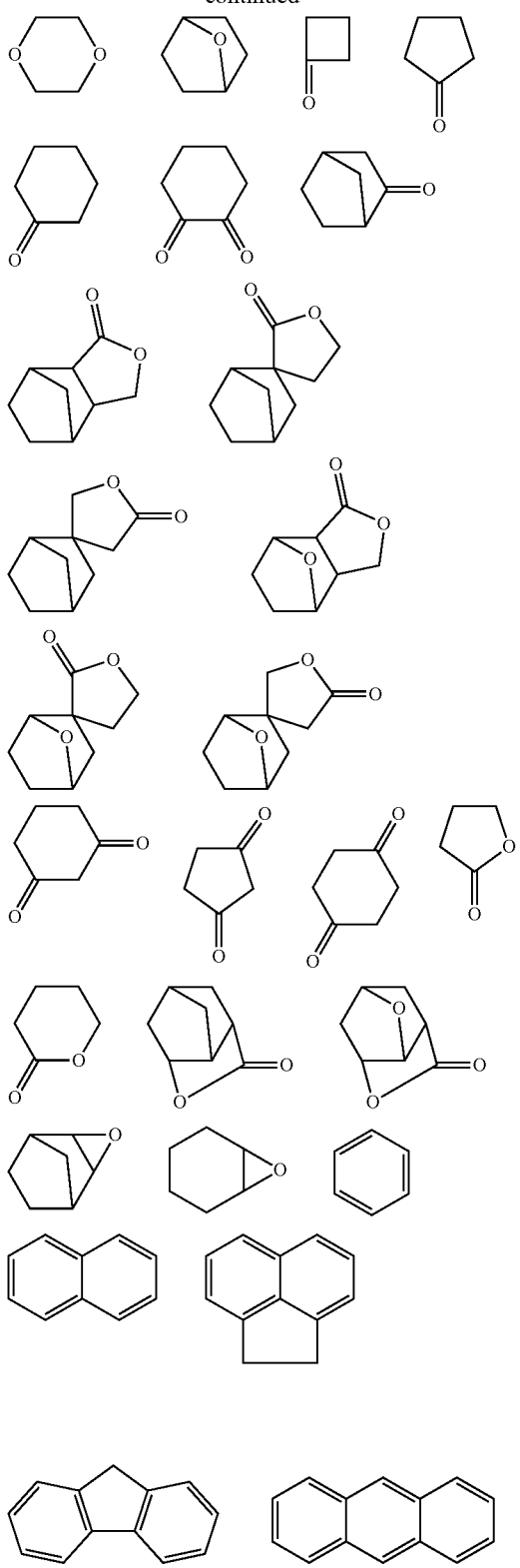
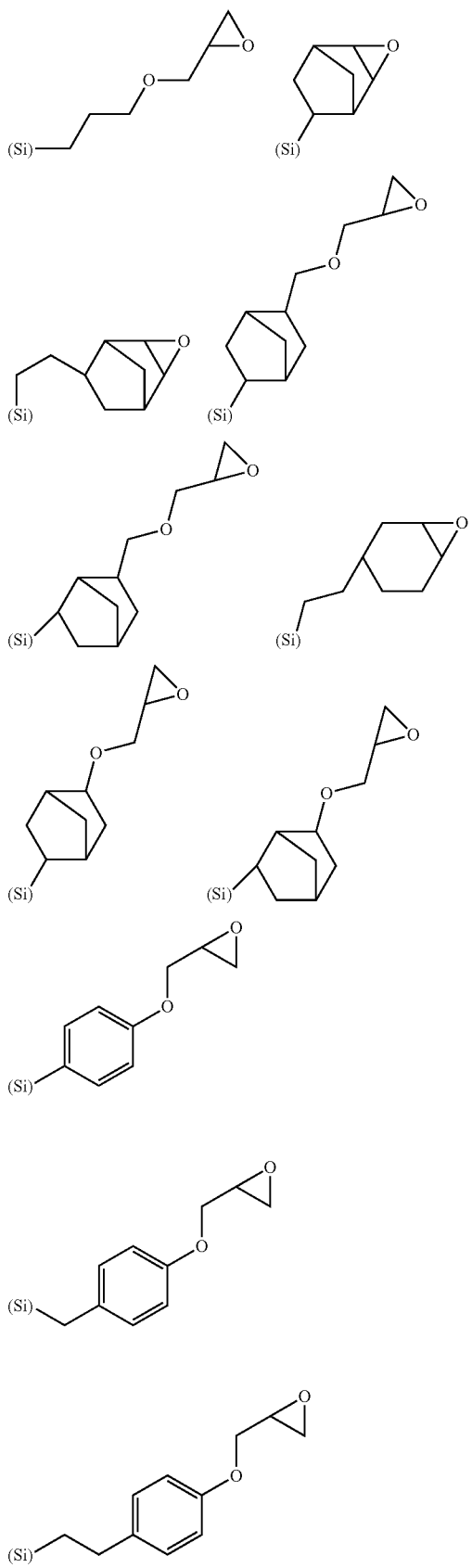
Preferable examples of the organic groups having one or more carbon-oxygen single bonds or carbon-oxygen double bonds in the general formula (Sm—R) include the followings. Should be noted that, in the following formulae, (Si) is depicted to show a bonding site to Si.

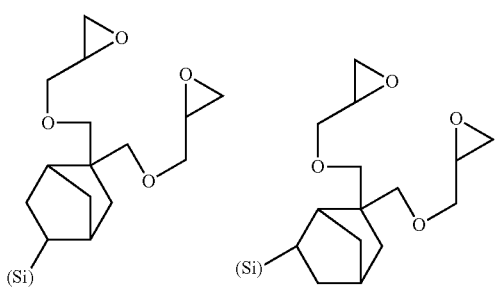
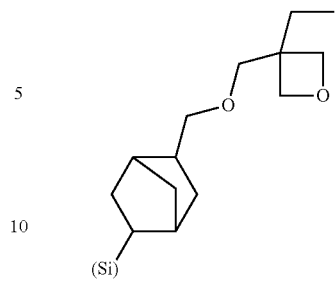
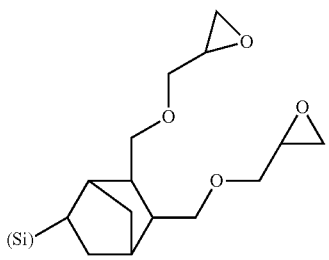
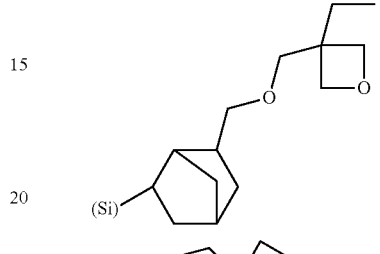
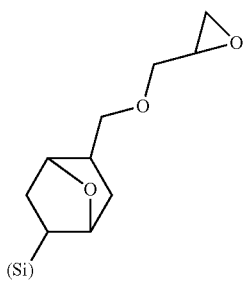
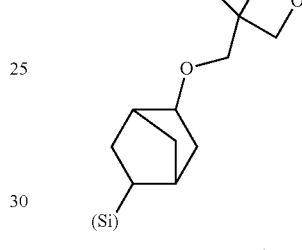
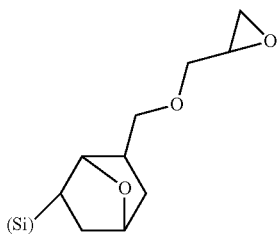
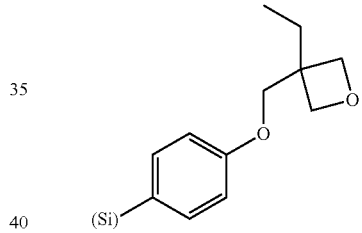
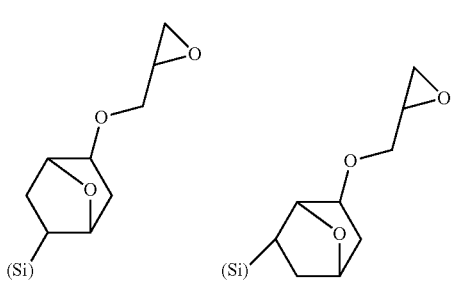
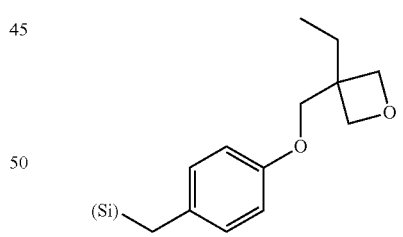
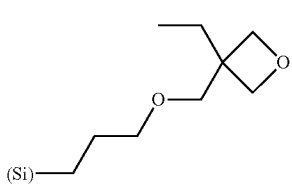
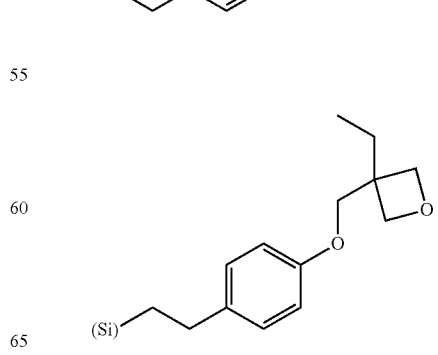

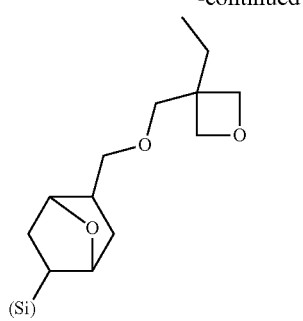
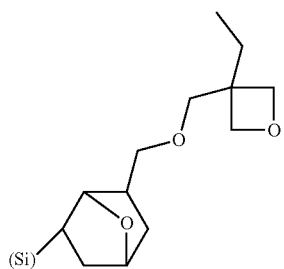
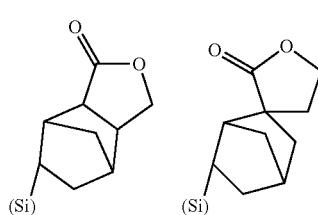
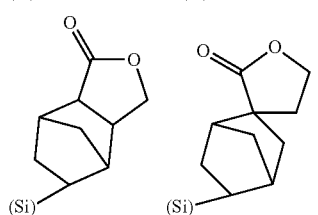
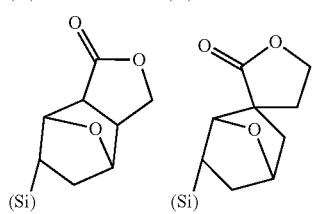
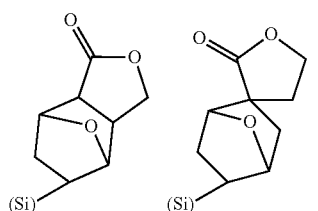
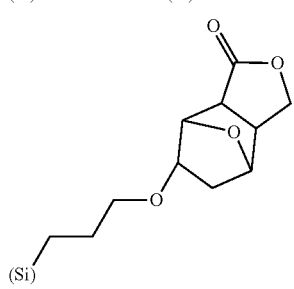
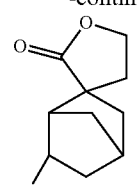
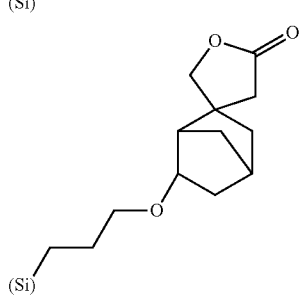
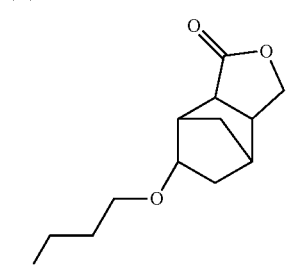
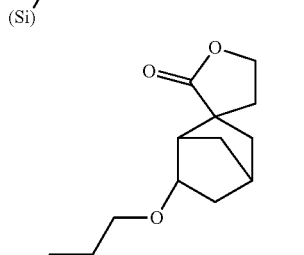
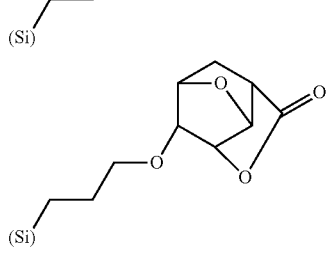
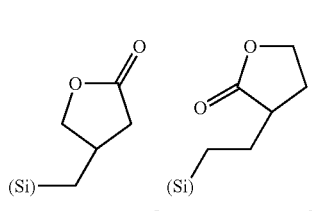
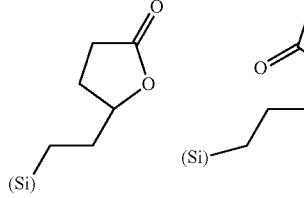

-continued
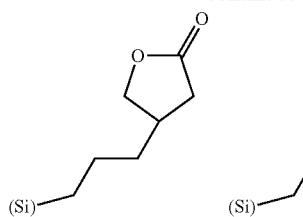
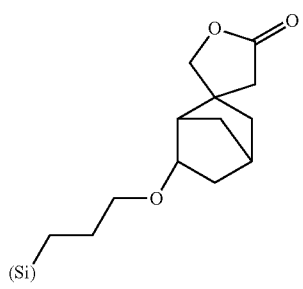
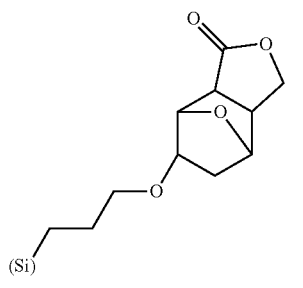
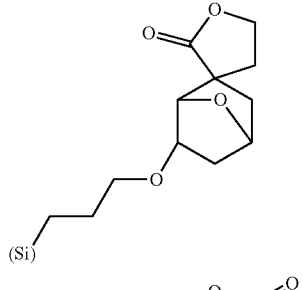
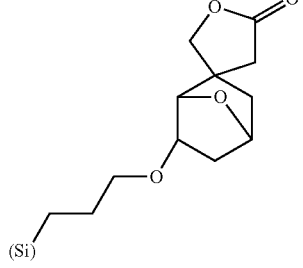
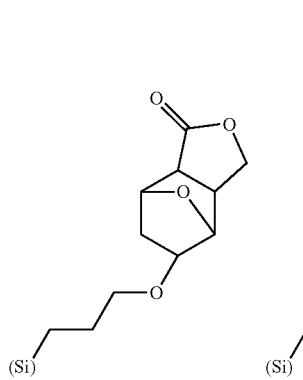
-continued
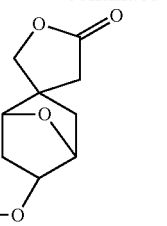
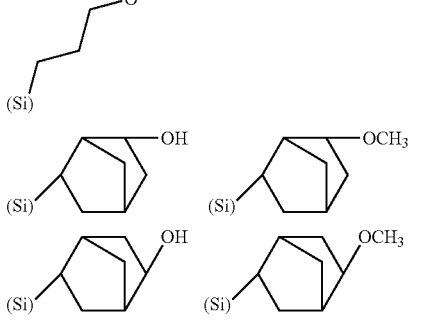
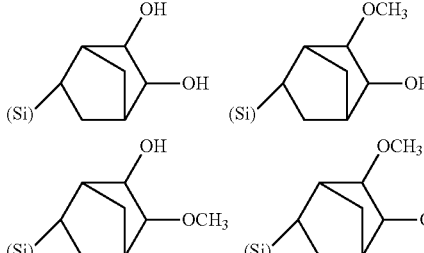
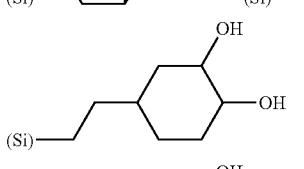
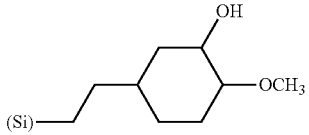
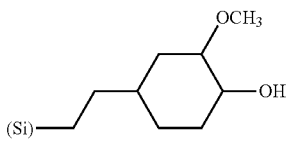
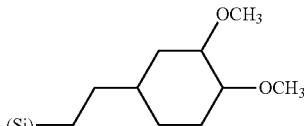
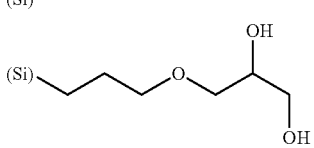

-continued
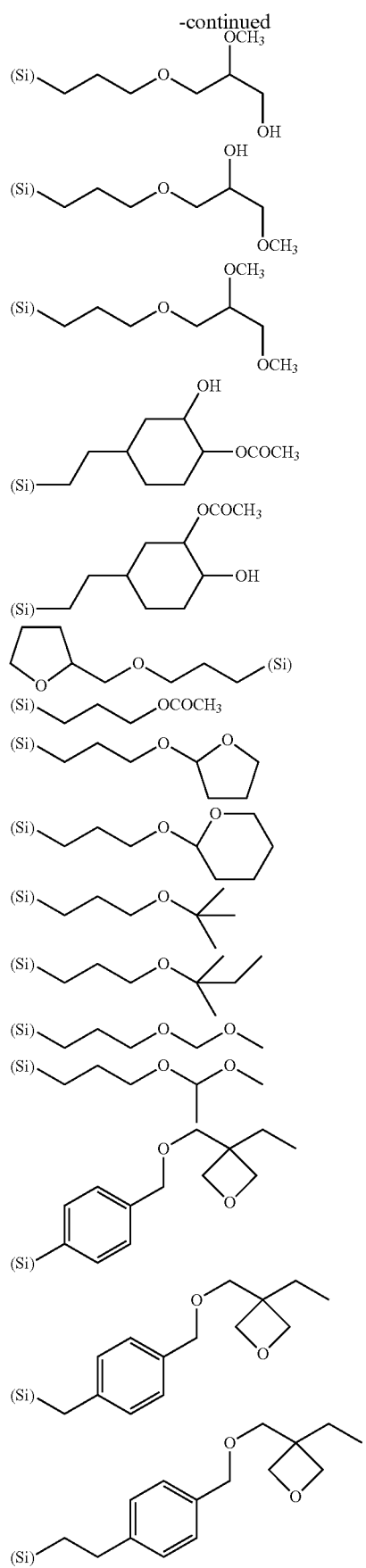
-continued
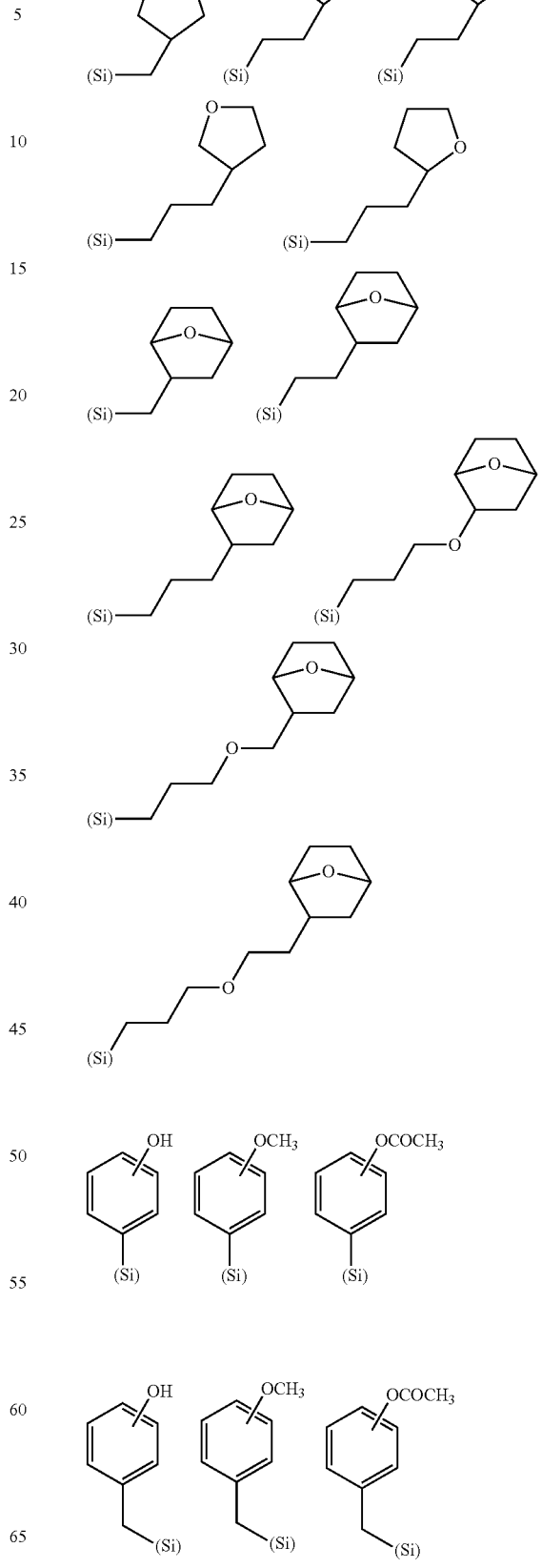

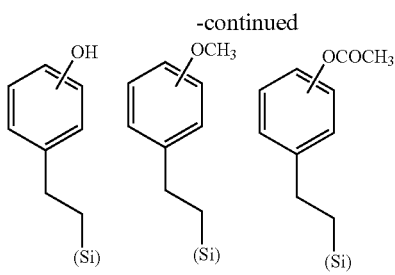

Moreover, as an example of the organic group of $R^1$, $R^2$, and $R^3$, an organic group containing a silicon-silicon bond can also be used. Specific examples thereof include the followings.

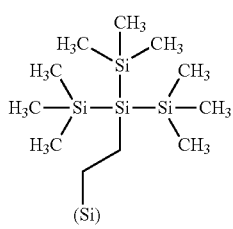

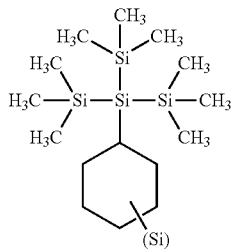

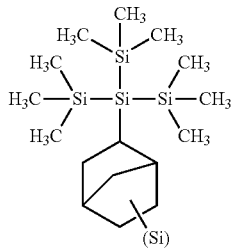

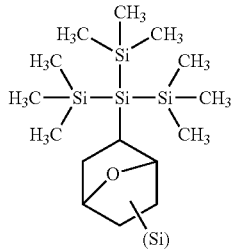

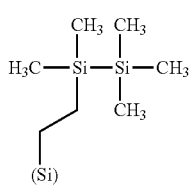

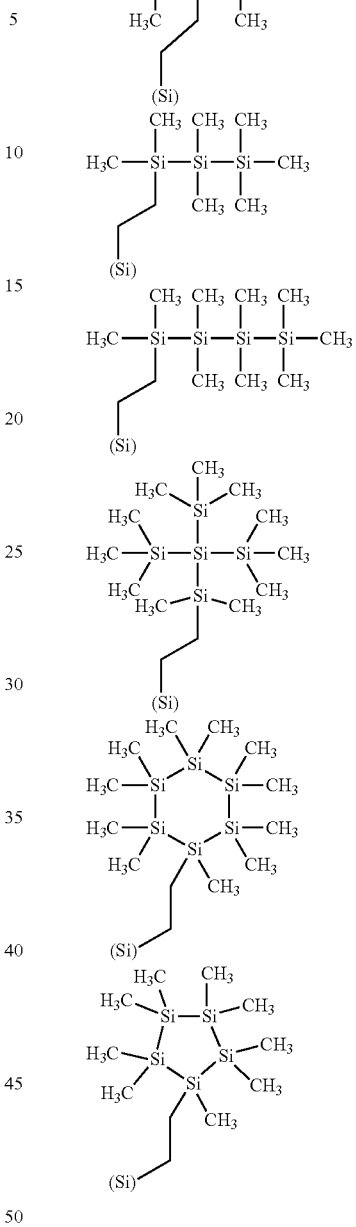

Moreover, as an example of the organic group of $R^1$, $R^2$, and $R^3$, an organic group having a protective group that is decomposed with an acid can also be used. Specific examples thereof include organic groups shown from paragraphs (0043) to (0048) of JP 2013-167669 A, and organic groups obtained from silicon compounds shown in paragraph (0056) of JP 2013-224279 A.

Further, as an example of the organic group of $R^1$, $R^2$, and $R^3$, an organic group having a fluorine atom can also be used. Specific examples thereof include organic groups obtained from silicon compounds shown from paragraphs (0059) to (0065) of JP 2012-53253 A. Furthermore, as an example of the organic group of $R^1$, $R^2$, and $R^3$, an organic group having a nitrogen atom or a sulfur atom can also be used.

The hydrolysable monomer (Sm) has, on a silicon atom shown as (Si) in the partial structure, as a hydrolysable group, one, two, or three of chlorine, bromine, iodine, an acetoxy group, a methoxy group, an ethoxy group, a propoxy group, or a butoxy group and the like bonded.

Curing Catalyst (Xc)

The present invention makes it possible to quantify the distance of diffusion of the curing catalyst (Xc) added to obtain a sufficient curing property when forming the silicon-containing film (Sf) from the composition for forming a silicon-containing film. Examples of curing catalysts (Xc) that can be measured include compounds described in JP 2007-302873 A, WO 2013/51558 A1, JP 2014-141585 A, WO 2014/21256 A1, JP 2015-229640 A and the like.

A specific example of the curing catalyst (Xc) includes a compound shown by the following general formula (Xc0):

$$L_aH_bA \tag{Xc0}$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) are shown below.

Moreover, an example of the ammonium salt (Xc-4) is shown below.

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. A represents a non-nucleophilic counter ion. $R^{208}$, $R^{209}$, $R^{210}$, and $R^{211}$ are the same as $R^{204}$, $R^{205}$, $R^{206}$, and $R^{207}$ and may be each a hydrogen atom. $R^{208}$ and $R^{209}$, or $R^{208}$, $R^{209}$, and $R^{210}$, may form a ring; when a ring is formed, $R^{208}$ and $R^{209}$, or $R^{208}$, $R^{209}$, and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion $A^-$ include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include the following salts of lithium, sodium, potassium, and cesium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate, benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, bisbenzyldimethylphenylammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a thermosetting polysiloxane (Xc-10) having a structure containing one of the ammonium salt, the sulfonium salt, the phosphonium salt, and the iodonium salt as a part can be given as an example of a curing catalyst (Xc).

As a raw material for producing (Xc-10) used here, it is possible to employ a compound shown by the following general formula (Xm):

$$R^{1A}_{A1}R^{2A}_{A2}R^{3A}_{A3}Si(OR^{OA})_{(4-A1-A2-A3)} \quad (Xm)$$

where $R^{OA}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

Here, examples of $OR^{OA}$ include a methyl group, an ethyl group, an n-propyl group, iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes the following general formula (Xm-1), which shows a hydrolysable silicon compound having a structure containing the sulfonium salt as a part:

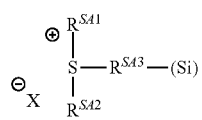
(Xm-1)

where $R^{SA1}$ and $R^{SA2}$ each represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a nitrogen atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-1), (Si) shows the bonding portion with Si.

Examples of $X^-$ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specifically, the following ions can be given as examples of cation moiety of a compound shown by the general formula (Xm-1).

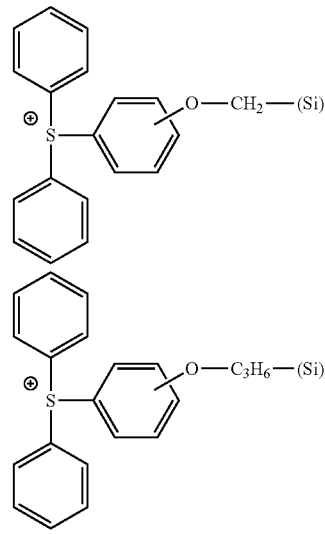

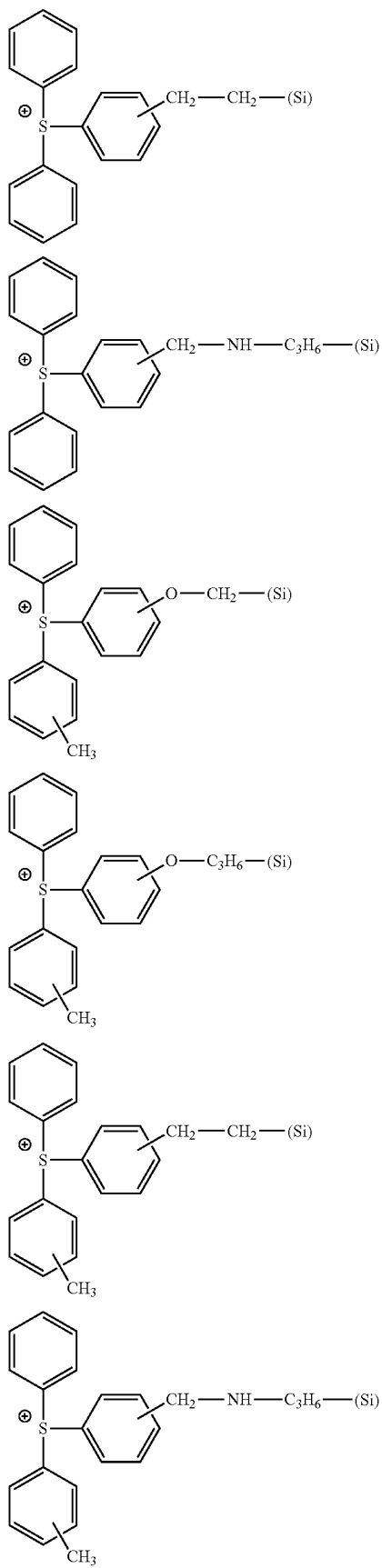
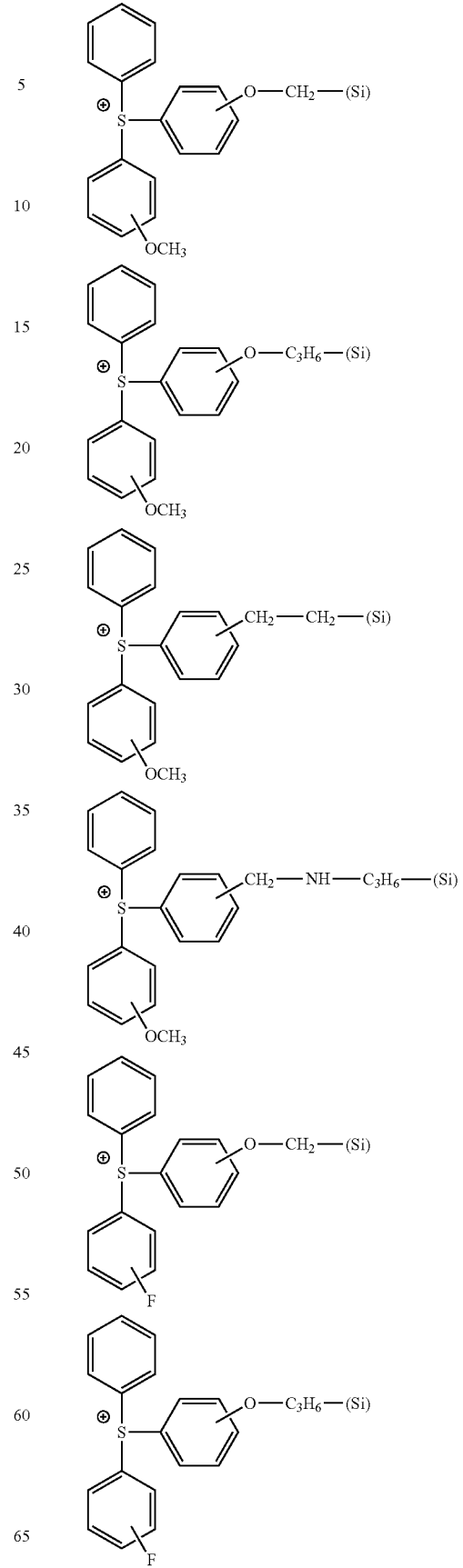

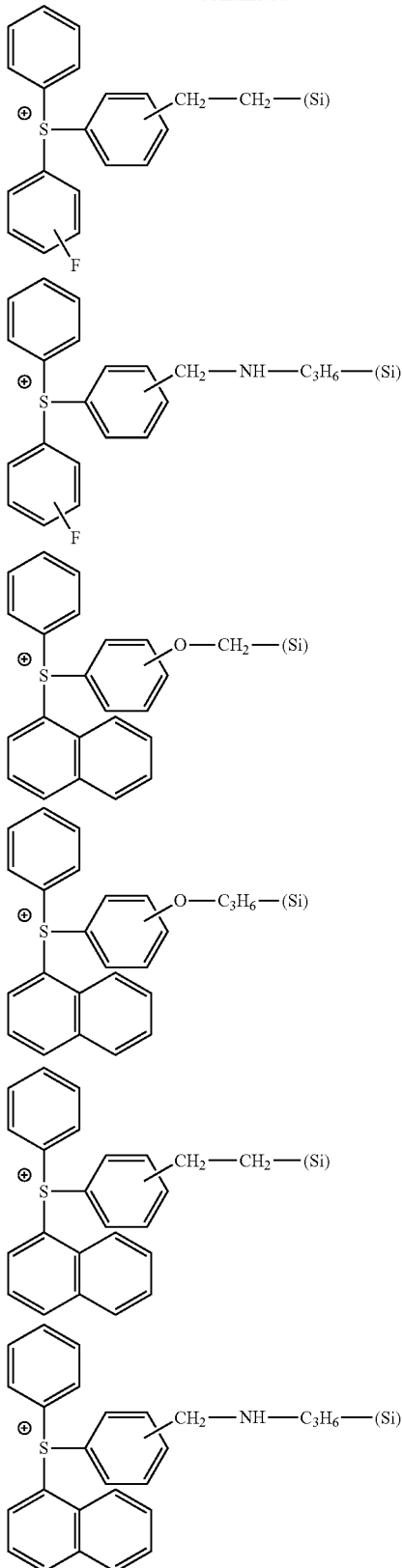

For example, a hydrolysable silicon compound having a structure containing the iodonium salt as a part can be shown by the following general formula (Xm-2):

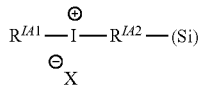

(Xm-2)

where $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of this group are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-2), (Si) shows the bonding portion with Si. $X^-$ is as described above.

Specifically, the following ions can be given as examples of cation moiety of a compound shown by the general formula (Xm-2).

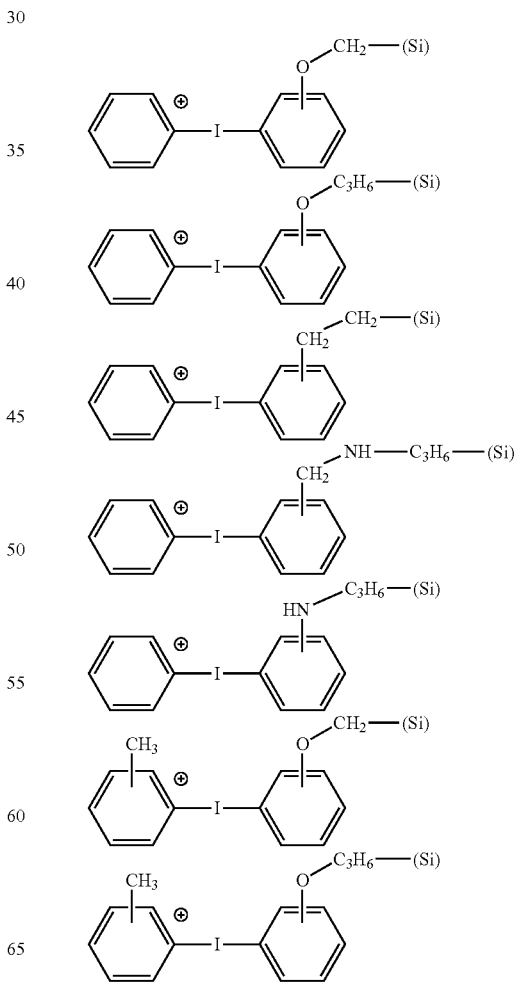

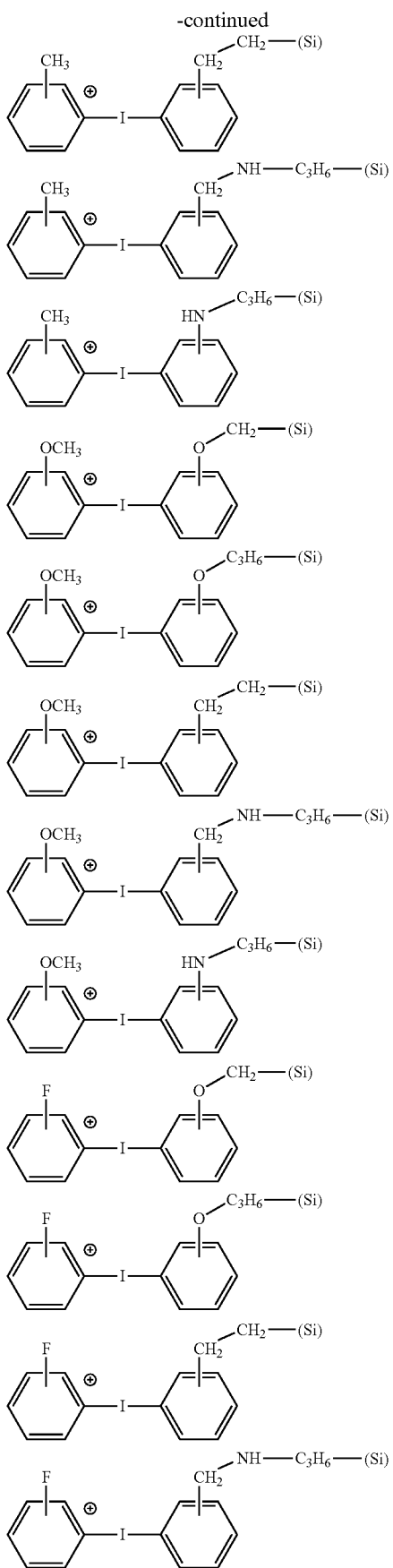

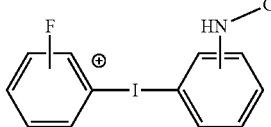

For example, a hydrolysable silicon compound having a structure containing the phosphonium salt as a part can be shown by the following general formula (Xm-3):

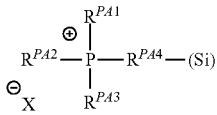

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a nitrogen atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-3), (Si) shows the bonding portion with Si. $X^-$ is as described above.

Specifically, the following ions can be given as examples of cation moiety of a compound shown by the general formula (Xm-3).

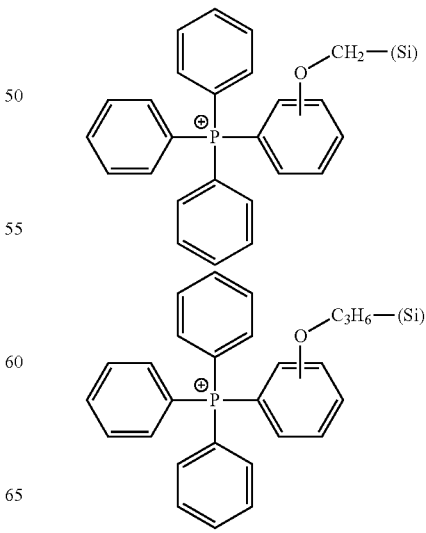

35
-continued
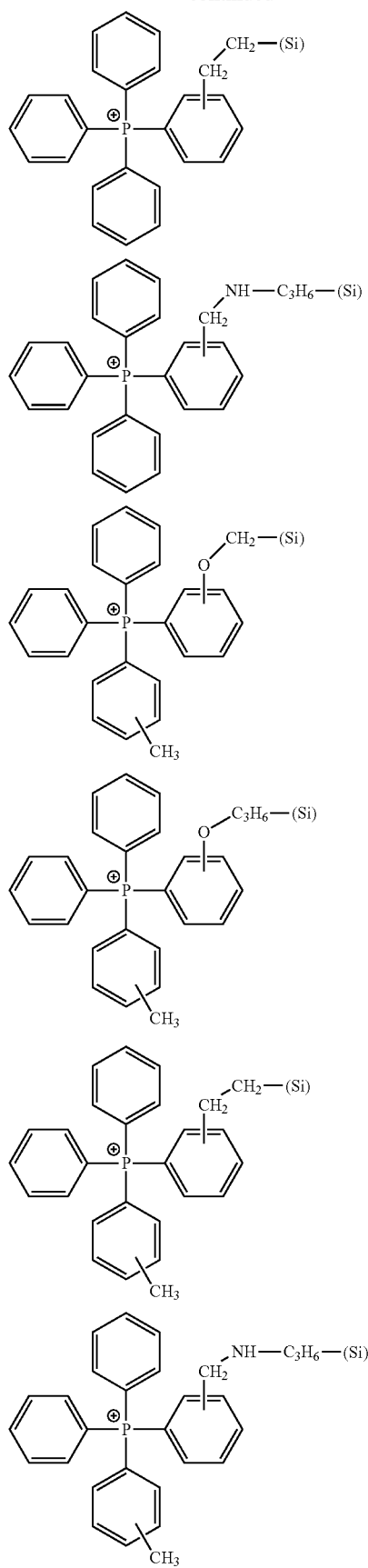
36
-continued
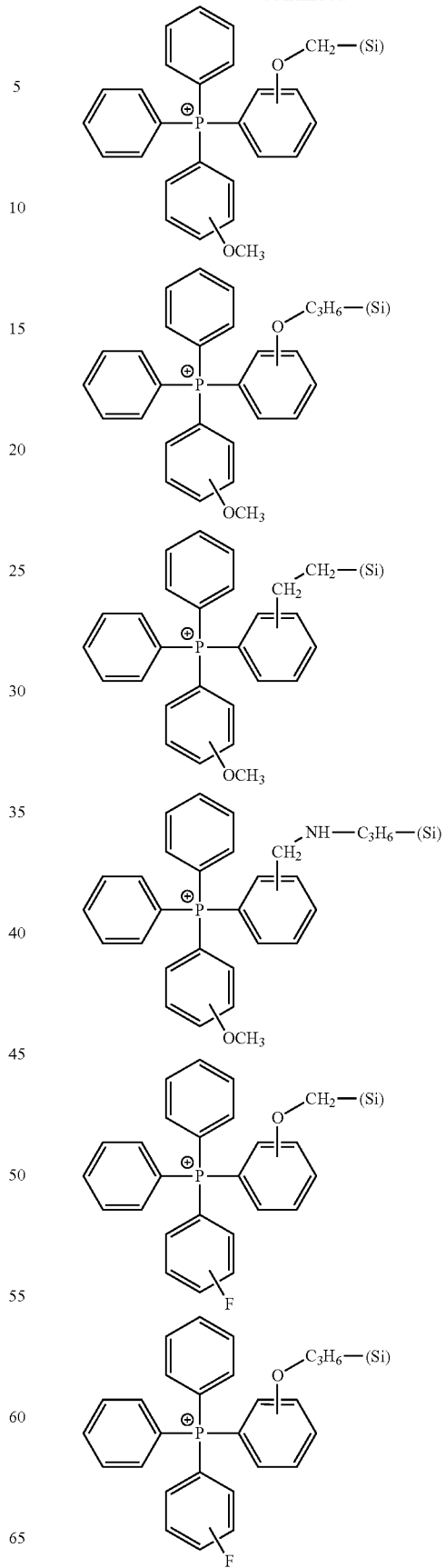

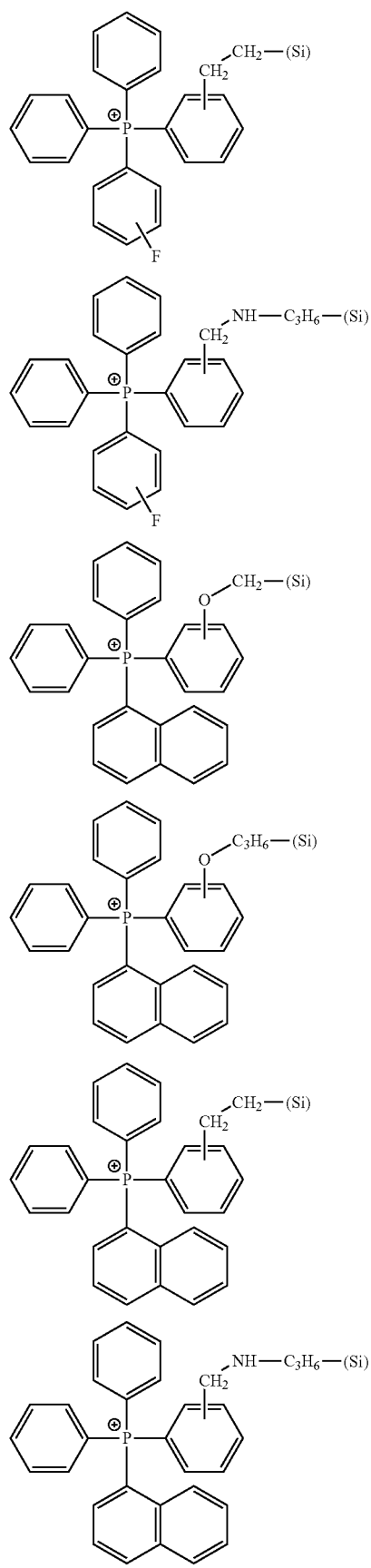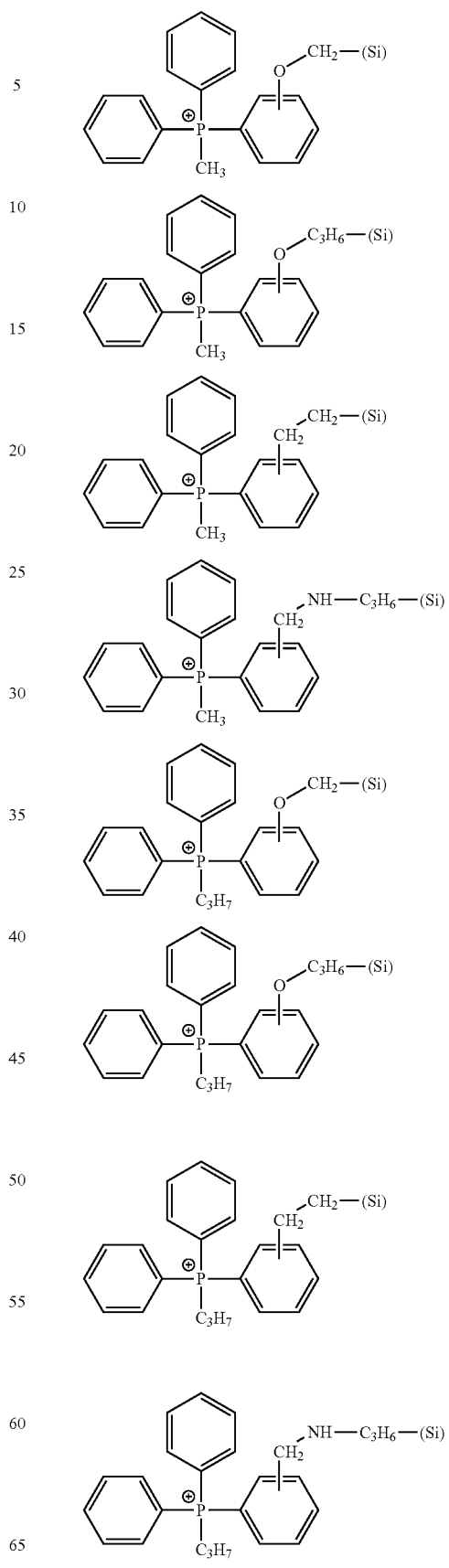

-continued

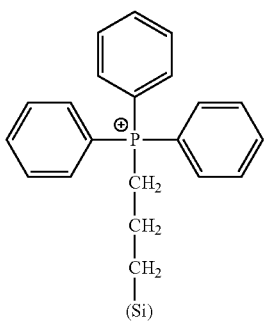

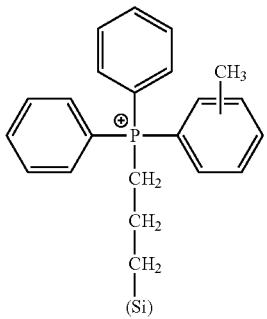

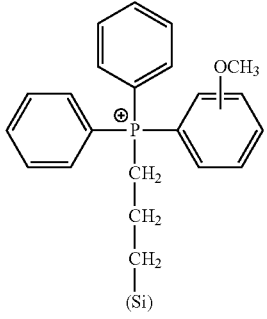

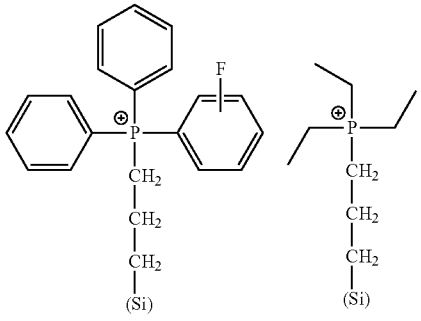

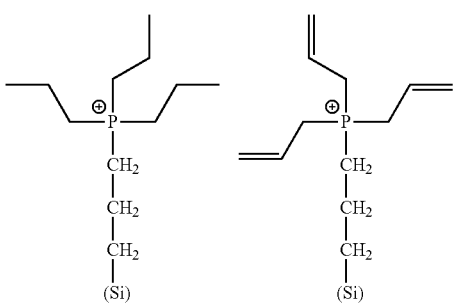

-continued

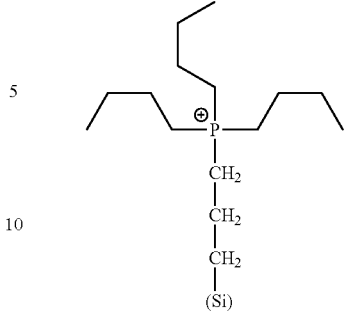

For example, a hydrolysable silicon compound having a structure containing the ammonium salt as a part can be shown by the following general formula (Xm-4):

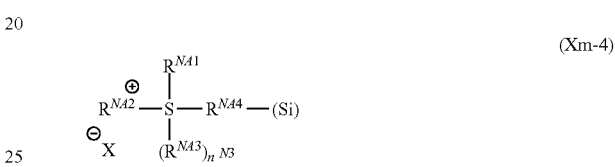

(Xm-4)

where $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, and an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms, or a heterocyclic ring or heteroaromatic ring containing nitrogen. $R^{NA4}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{N3}=0$; in the other cases, $n^{N3}=1$.

Should be noted that in the general formula (Xm-4), (Si) shows the bonding portion with Si. $X^-$ is as described above.

Specifically, the following ions can be given as examples of cation moiety of a compound shown by the general formula (Xm-4).

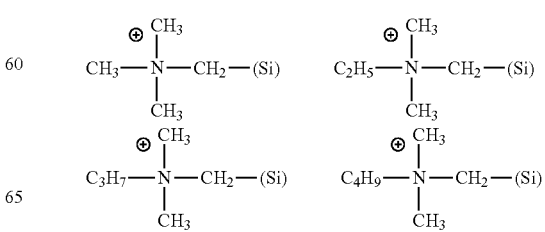

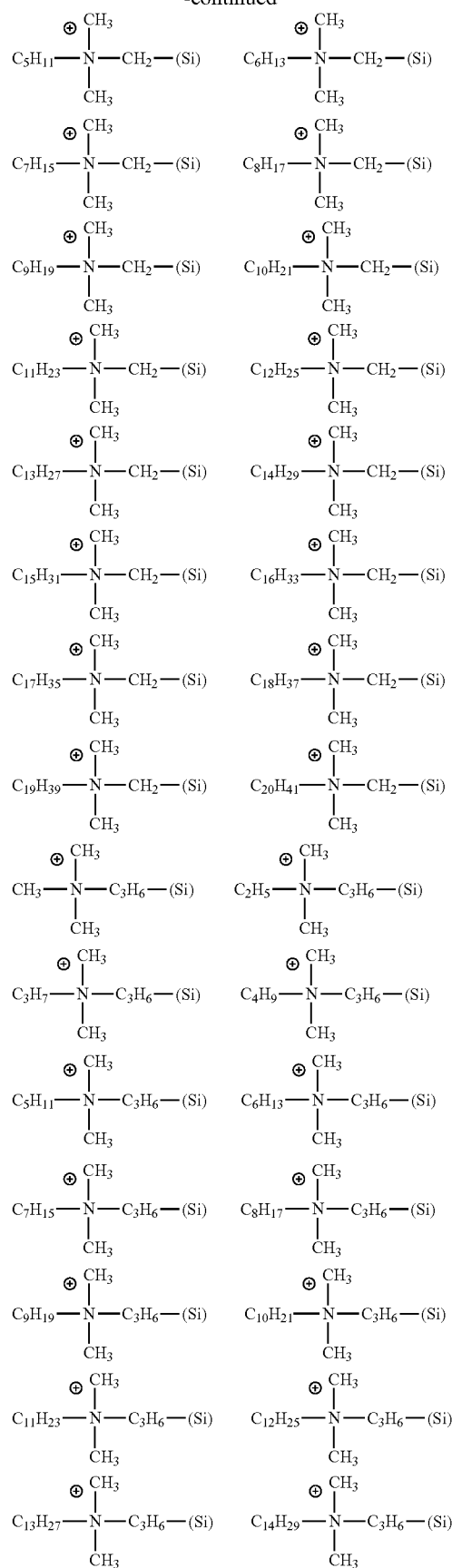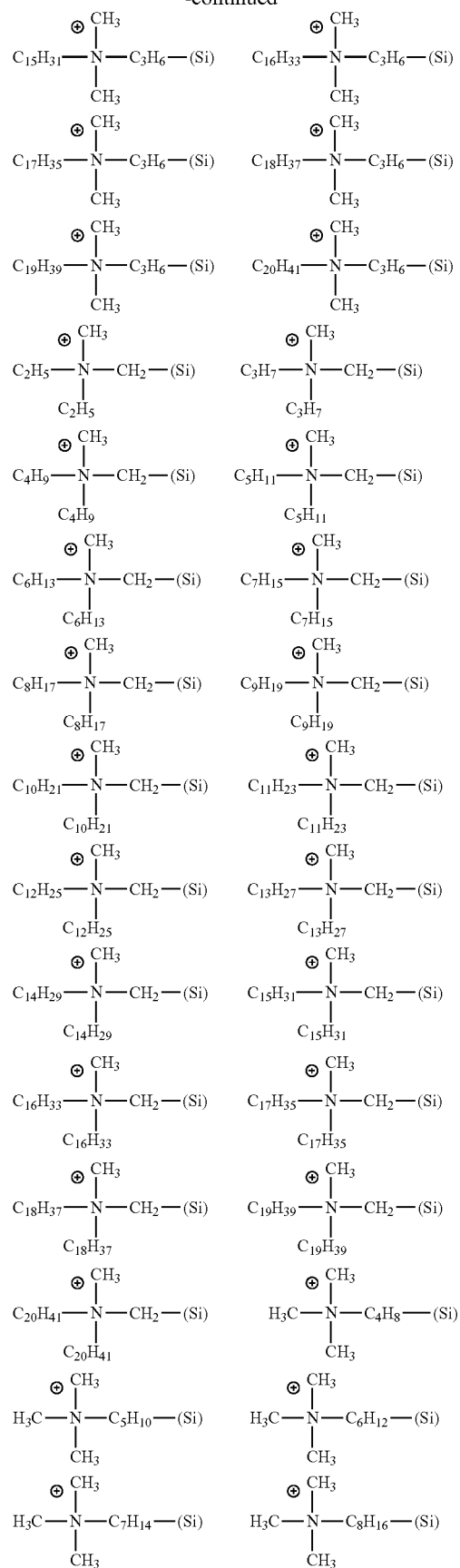

-continued $$H_3C-\overset{\overset{\oplus\ CH_3}{|}}{\underset{\underset{CH_3}{|}}{N}}-C_9H_{18}-(Si)$$

$$H_3C-\overset{\overset{\oplus\ CH_3}{|}}{\underset{\underset{CH_3}{|}}{N}}-C_{11}H_{22}-(Si)$$

$$H_3C-\overset{\overset{\oplus\ CH_3}{|}}{\underset{\underset{CH_3}{|}}{N}}-C_{13}H_{26}-(Si)$$

$$H_3C-\overset{\overset{\oplus\ CH_3}{|}}{\underset{\underset{CH_3}{|}}{N}}-C_{15}H_{30}-(Si)$$

$$H_3C-\overset{\overset{\oplus\ CH_3}{|}}{\underset{\underset{CH_3}{|}}{N}}-C_{17}H_{34}-(Si)$$

$$H_3C-\overset{\overset{\oplus\ CH_3}{|}}{\underset{\underset{CH_3}{|}}{N}}-C_{19}H_{38}-(Si)$$

$$C_2H_5-\overset{\overset{\oplus\ CH_3}{|}}{\underset{\underset{C_2H_5}{|}}{N}}-C_3H_6-(Si)$$

$$C_4H_9-\overset{\overset{\oplus\ CH_3}{|}}{\underset{\underset{C_4H_9}{|}}{N}}-C_3H_6-(Si)$$

$$C_6H_{13}-\overset{\overset{\oplus\ CH_3}{|}}{\underset{\underset{C_6H_{13}}{|}}{N}}-C_3H_6-(Si)$$

$$C_8H_{17}-\overset{\overset{\oplus\ CH_3}{|}}{\underset{\underset{C_8H_{17}}{|}}{N}}-C_3H_6-(Si)$$

$$C_{10}H_{21}-\overset{\overset{\oplus\ CH_3}{|}}{\underset{\underset{C_{10}H_{21}}{|}}{N}}-C_3H_6-(Si)$$

$$C_{12}H_{25}-\overset{\overset{\oplus\ CH_3}{|}}{\underset{\underset{C_{12}H_{25}}{|}}{N}}-C_3H_6-(Si)$$

$$C_{14}H_{29}-\overset{\overset{\oplus\ CH_3}{|}}{\underset{\underset{C_{14}H_{29}}{|}}{N}}-C_3H_6-(Si)$$

$$C_{16}H_{33}-\overset{\overset{\oplus\ CH_3}{|}}{\underset{\underset{C_{16}H_{33}}{|}}{N}}-C_3H_6-(Si)$$

$$C_{18}H_{37}-\overset{\overset{\oplus\ CH_3}{|}}{\underset{\underset{C_{18}H_{37}}{|}}{N}}-C_3H_6-(Si)$$

$$H_3C-\overset{\overset{\oplus\ CH_3}{|}}{\underset{\underset{CH_3}{|}}{N}}-C_{10}H_{20}-(Si)$$

$$H_3C-\overset{\overset{\oplus\ CH_3}{|}}{\underset{\underset{CH_3}{|}}{N}}-C_{12}H_{24}-(Si)$$

$$H_3C-\overset{\overset{\oplus\ CH_3}{|}}{\underset{\underset{CH_3}{|}}{N}}-C_{14}H_{28}-(Si)$$

$$H_3C-\overset{\overset{\oplus\ CH_3}{|}}{\underset{\underset{CH_3}{|}}{N}}-C_{16}H_{32}-(Si)$$

$$H_3C-\overset{\overset{\oplus\ CH_3}{|}}{\underset{\underset{CH_3}{|}}{N}}-C_{18}H_{36}-(Si)$$

$$H_3C-\overset{\overset{\oplus\ CH_3}{|}}{\underset{\underset{CH_3}{|}}{N}}-C_{20}H_{40}-(Si)$$

$$C_3H_7-\overset{\overset{\oplus\ CH_3}{|}}{\underset{\underset{C_3H_7}{|}}{N}}-C_3H_6-(Si)$$

$$C_5H_{11}-\overset{\overset{\oplus\ CH_3}{|}}{\underset{\underset{C_5H_{11}}{|}}{N}}-C_3H_6-(Si)$$

$$C_7H_{15}-\overset{\overset{\oplus\ CH_3}{|}}{\underset{\underset{C_7H_{15}}{|}}{N}}-C_3H_6-(Si)$$

$$C_9H_{19}-\overset{\overset{\oplus\ CH_3}{|}}{\underset{\underset{C_9H_{19}}{|}}{N}}-C_3H_6-(Si)$$

$$C_{11}H_{23}-\overset{\overset{\oplus\ CH_3}{|}}{\underset{\underset{C_{11}H_{23}}{|}}{N}}-C_3H_6-(Si)$$

$$C_{13}H_{27}-\overset{\overset{\oplus\ CH_3}{|}}{\underset{\underset{C_{13}H_{27}}{|}}{N}}-C_3H_6-(Si)$$

$$C_{15}H_{31}-\overset{\overset{\oplus\ CH_3}{|}}{\underset{\underset{C_{15}H_{31}}{|}}{N}}-C_3H_6-(Si)$$

$$C_{17}H_{35}-\overset{\overset{\oplus\ CH_3}{|}}{\underset{\underset{C_{17}H_{35}}{|}}{N}}-C_3H_6-(Si)$$

$$C_{19}H_{39}-\overset{\overset{\oplus\ CH_3}{|}}{\underset{\underset{C_{19}H_{39}}{|}}{N}}-C_3H_6-(Si)$$

-continued $$C_{20}H_{41}-\overset{\overset{\oplus\ CH_3}{|}}{\underset{\underset{C_{20}H_{41}}{|}}{N}}-C_3H_6-(Si)$$

$$H_3C-\overset{\overset{\oplus\ CH_3}{|}}{\underset{\underset{CH_3}{|}}{N}}-C_2H_4-NH-CH_2-(Si)$$

$$H_3C-\overset{\overset{\oplus\ CH_3}{|}}{\underset{\underset{CH_3}{|}}{N}}-C_3H_6-NH-CH_2-(Si)$$

$$H_3C-\overset{\overset{\oplus\ CH_3}{|}}{\underset{\underset{CH_3}{|}}{N}}-C_4H_8-NH-CH_2-(Si)$$

$$H_3C-\overset{\overset{\oplus\ CH_3}{|}}{\underset{\underset{CH_3}{|}}{N}}-C_5H_{10}-NH-CH_2-(Si)$$

$$H_3C-\overset{\overset{\oplus\ CH_3}{|}}{\underset{\underset{CH_3}{|}}{N}}-C_6H_{12}-NH-CH_2-(Si)$$

$$H_3C-\overset{\overset{\oplus\ CH_3}{|}}{\underset{\underset{CH_3}{|}}{N}}-C_7H_{14}-NH-CH_2-(Si)$$

$$H_3C-\overset{\overset{\oplus\ CH_3}{|}}{\underset{\underset{CH_3}{|}}{N}}-C_8H_{16}-NH-CH_2-(Si)$$

$$H_3C-\overset{\overset{\oplus\ CH_3}{|}}{\underset{\underset{CH_3}{|}}{N}}-C_9H_{18}-NH-CH_2-(Si)$$

$$H_3C-\overset{\overset{\oplus\ CH_3}{|}}{\underset{\underset{CH_3}{|}}{N}}-C_{10}H_{20}-NH-CH_2-(Si)$$

$$H_3C-\overset{\overset{\oplus\ CH_3}{|}}{\underset{\underset{CH_3}{|}}{N}}-C_{11}H_{22}-NH-CH_2-(Si)$$

$$H_3C-\overset{\overset{\oplus\ CH_3}{|}}{\underset{\underset{CH_3}{|}}{N}}-C_{12}H_{24}-NH-CH_2-(Si)$$

$$H_3C-\overset{\overset{\oplus\ CH_3}{|}}{\underset{\underset{CH_3}{|}}{N}}-C_{13}H_{26}-NH-CH_2-(Si)$$

$$H_3C-\overset{\overset{\oplus\ CH_3}{|}}{\underset{\underset{CH_3}{|}}{N}}-C_{14}H_{28}-NH-CH_2-(Si)$$

$$H_3C-\overset{\overset{\oplus\ CH_3}{|}}{\underset{\underset{CH_3}{|}}{N}}-C_{15}H_{30}-NH-CH_2-(Si)$$

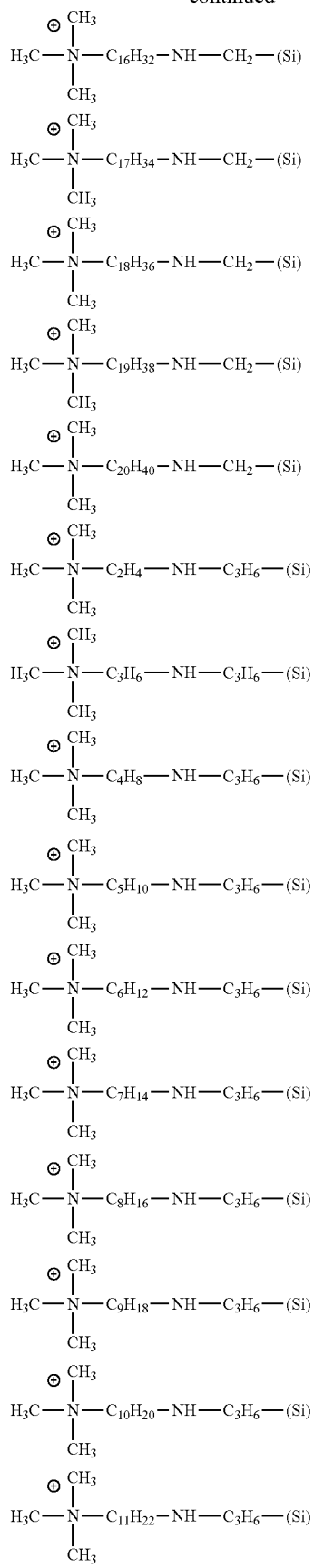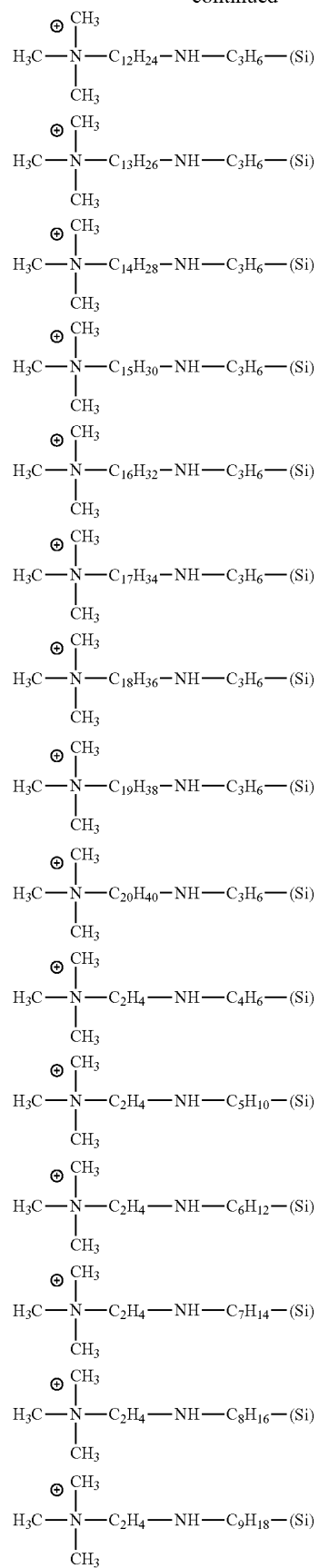

-continued
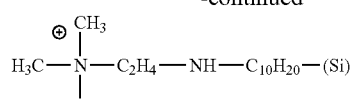
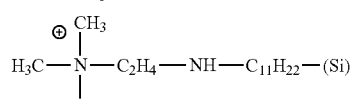
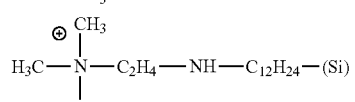
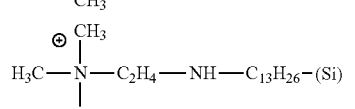
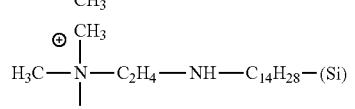
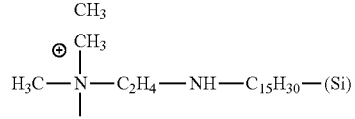
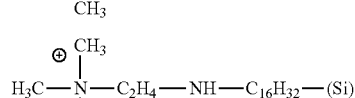
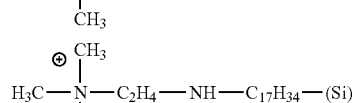
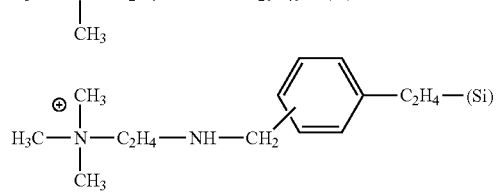
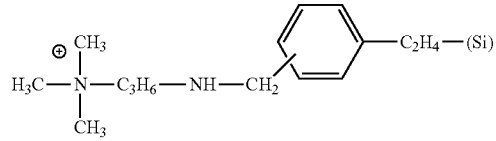
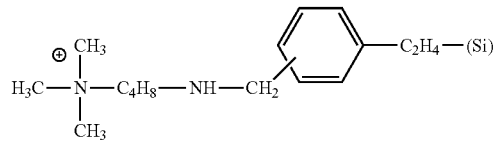
-continued
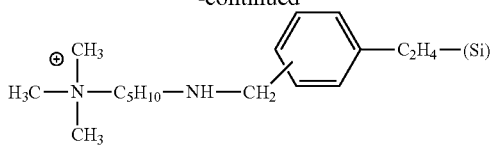
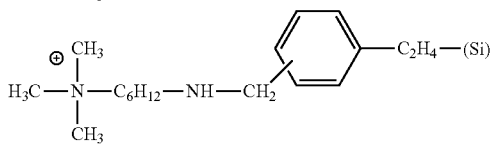
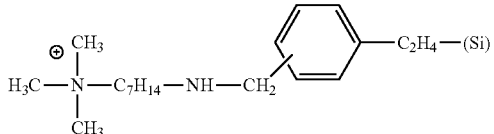
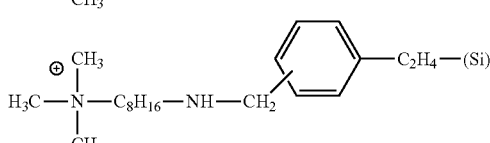
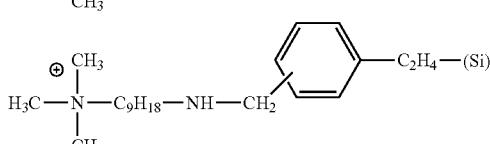
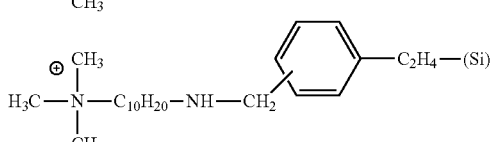
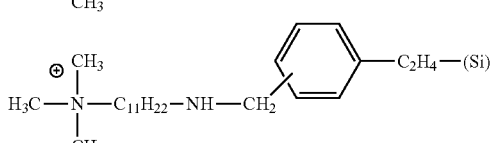
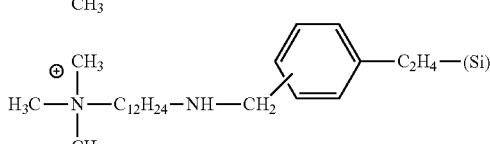
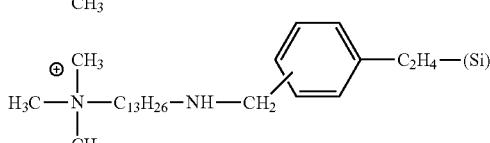
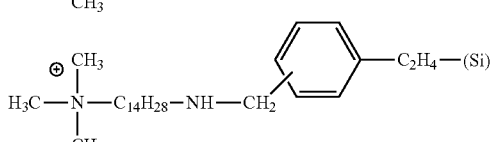
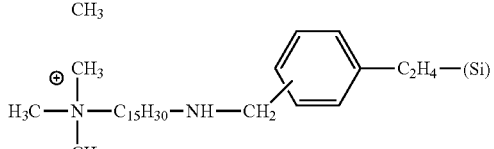
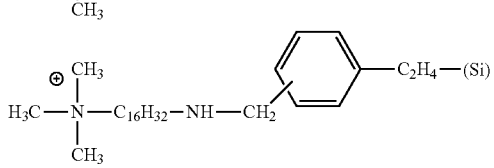

49

$H_3C-\overset{\overset{\oplus}{\underset{CH_3}{|}}}{\underset{CH_3}{N}}-C_{17}H_{34}-NH-CH_2-C_6H_4-C_2H_4-(Si)$ $H_3C-\overset{\overset{\oplus}{\underset{CH_3}{|}}}{\underset{CH_3}{N}}-C_{18}H_{36}-NH-CH_2-C_6H_4-C_2H_4-(Si)$ $H_3C-\overset{\overset{\oplus}{\underset{CH_3}{|}}}{\underset{CH_3}{N}}-C_{19}H_{38}-NH-CH_2-C_6H_4-C_2H_4-(Si)$ $H_3C-\overset{\overset{\oplus}{\underset{CH_3}{|}}}{\underset{CH_3}{N}}-C_{20}H_{40}-NH-CH_2-C_6H_4-C_2H_4-(Si)$ $H_3C-\overset{\overset{\oplus}{\underset{CH_3}{|}}}{\underset{CH_3}{N}}-CH_2-C_6H_4-C_2H_4-(Si)$ $C_2H_5-\overset{\overset{\oplus}{\underset{CH_3}{|}}}{\underset{CH_3}{N}}-CH_2-C_6H_4-C_2H_4-(Si)$ $C_3H_7-\overset{\overset{\oplus}{\underset{CH_3}{|}}}{\underset{CH_3}{N}}-CH_2-C_6H_4-C_2H_4-(Si)$ $C_4H_9-\overset{\overset{\oplus}{\underset{CH_3}{|}}}{\underset{CH_3}{N}}-CH_2-C_6H_4-C_2H_4-(Si)$ $C_5H_{11}-\overset{\overset{\oplus}{\underset{CH_3}{|}}}{\underset{CH_3}{N}}-CH_2-C_6H_4-C_2H_4-(Si)$ $C_6H_{13}-\overset{\overset{\oplus}{\underset{CH_3}{|}}}{\underset{CH_3}{N}}-CH_2-C_6H_4-C_2H_4-(Si)$ $C_7H_{15}-\overset{\overset{\oplus}{\underset{CH_3}{|}}}{\underset{CH_3}{N}}-CH_2-C_6H_4-C_2H_4-(Si)$

50

$C_8H_{17}-\overset{\overset{\oplus}{\underset{CH_3}{|}}}{\underset{CH_3}{N}}-CH_2-C_6H_4-C_2H_4-(Si)$ $C_9H_{19}-\overset{\overset{\oplus}{\underset{CH_3}{|}}}{\underset{CH_3}{N}}-CH_2-C_6H_4-C_2H_4-(Si)$ $C_{10}H_{21}-\overset{\overset{\oplus}{\underset{CH_3}{|}}}{\underset{CH_3}{N}}-CH_2-C_6H_4-C_2H_4-(Si)$ $C_{11}H_{23}-\overset{\overset{\oplus}{\underset{CH_3}{|}}}{\underset{CH_3}{N}}-CH_2-C_6H_4-C_2H_4-(Si)$ $C_{12}H_{25}-\overset{\overset{\oplus}{\underset{CH_3}{|}}}{\underset{CH_3}{N}}-CH_2-C_6H_4-C_2H_4-(Si)$ $C_{13}H_{27}-\overset{\overset{\oplus}{\underset{CH_3}{|}}}{\underset{CH_3}{N}}-CH_2-C_6H_4-C_2H_4-(Si)$ $C_{14}H_{29}-\overset{\overset{\oplus}{\underset{CH_3}{|}}}{\underset{CH_3}{N}}-CH_2-C_6H_4-C_2H_4-(Si)$ $C_{15}H_{31}-\overset{\overset{\oplus}{\underset{CH_3}{|}}}{\underset{CH_3}{N}}-CH_2-C_6H_4-C_2H_4-(Si)$ $C_{16}H_{33}-\overset{\overset{\oplus}{\underset{CH_3}{|}}}{\underset{CH_3}{N}}-CH_2-C_6H_4-C_2H_4-(Si)$ $C_{17}H_{35}-\overset{\overset{\oplus}{\underset{CH_3}{|}}}{\underset{CH_3}{N}}-CH_2-C_6H_4-C_2H_4-(Si)$ $C_{18}H_{37}-\overset{\overset{\oplus}{\underset{CH_3}{|}}}{\underset{CH_3}{N}}-CH_2-C_6H_4-C_2H_4-(Si)$ $C_{19}H_{39}-\overset{\overset{\oplus}{\underset{CH_3}{|}}}{\underset{CH_3}{N}}-CH_2-C_6H_4-C_2H_4-(Si)$ $C_{20}H_{21}-\overset{\overset{\oplus}{\underset{CH_3}{|}}}{\underset{CH_3}{N}}-CH_2-C_6H_4-C_2H_4-(Si)$

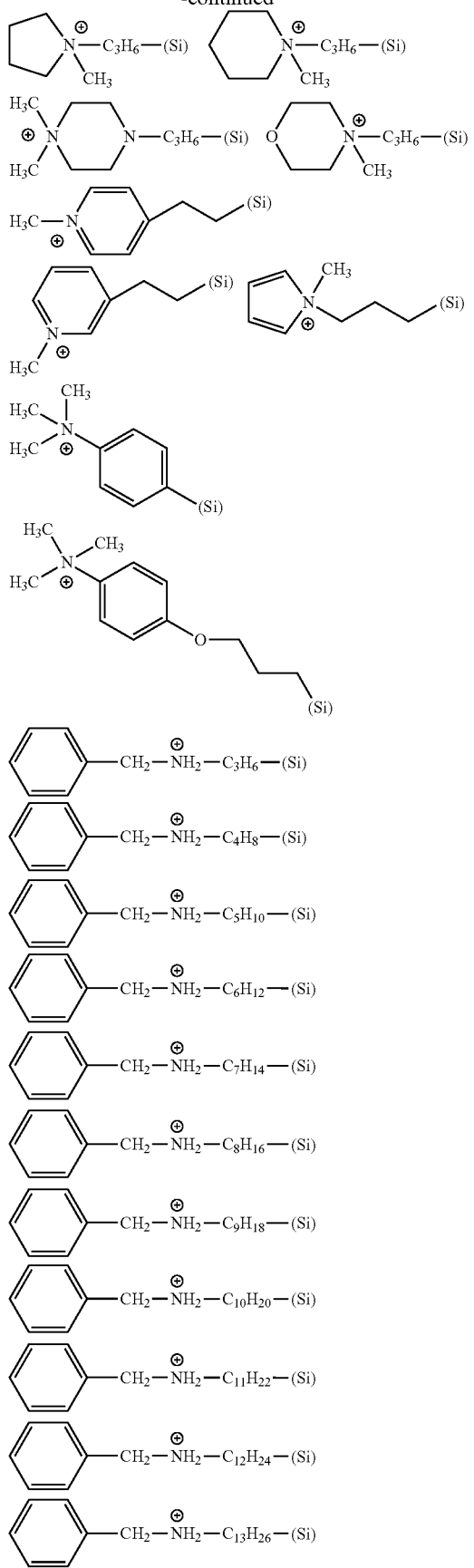
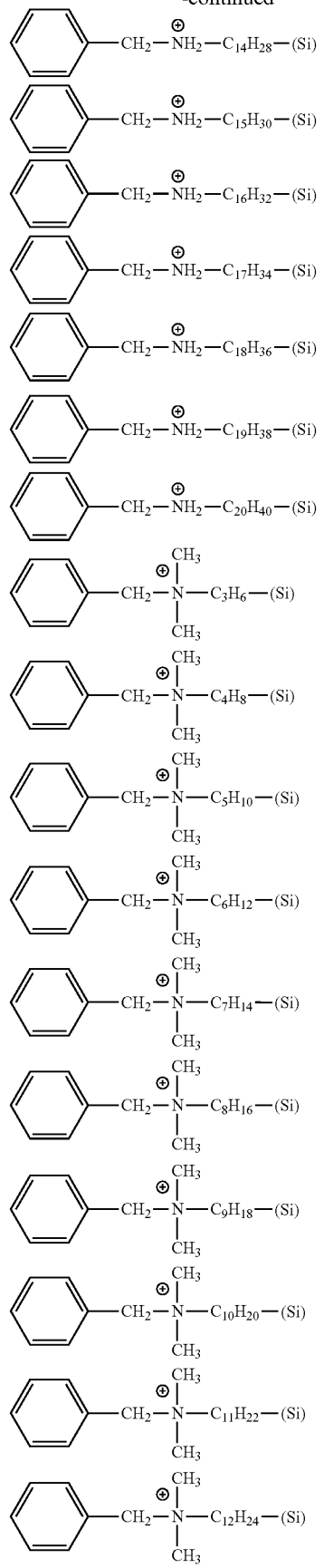

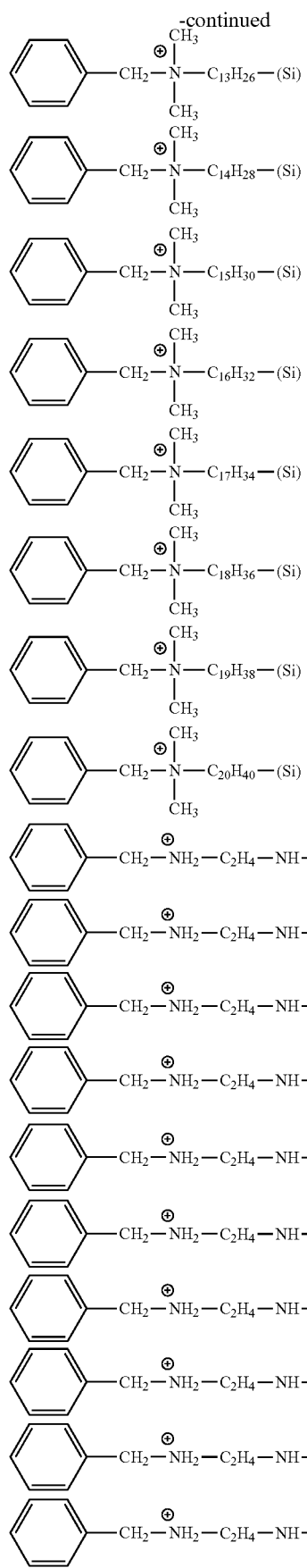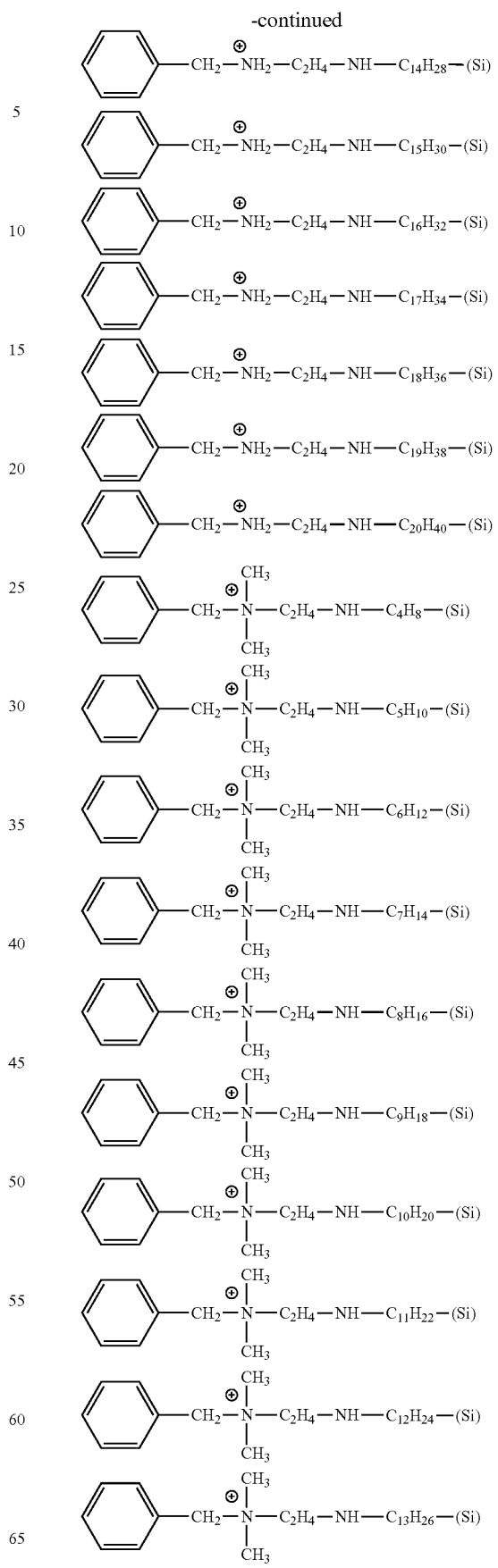

-continued

- Ph-CH$_2$-N$^+$(CH$_3$)$_2$-C$_2$H$_4$-NH-C$_{14}$H$_{28}$-(Si)
- Ph-CH$_2$-N$^+$(CH$_3$)$_2$-C$_2$H$_4$-NH-C$_{15}$H$_{30}$-(Si)
- Ph-CH$_2$-N$^+$(CH$_3$)$_2$-C$_2$H$_4$-NH-C$_{16}$H$_{32}$-(Si)
- Ph-CH$_2$-N$^+$(CH$_3$)$_2$-C$_2$H$_4$-NH-C$_{17}$H$_{34}$-(Si)
- Ph-CH$_2$-N$^+$(CH$_3$)$_2$-C$_2$H$_4$-NH-C$_{18}$H$_{36}$-(Si)
- Ph-CH$_2$-N$^+$(CH$_3$)$_2$-C$_2$H$_4$-NH-C$_{19}$H$_{38}$-(Si)
- Ph-CH$_2$-N$^+$(CH$_3$)$_2$-C$_2$H$_4$-NH-C$_{20}$H$_{40}$-(Si)
- Ph-CH$_2$-N$^+$H$_2$-C$_2$H$_4$-NH-CH$_2$-(Si)
- Ph-CH$_2$-N$^+$H$_2$-C$_3$H$_6$-NH-CH$_2$-(Si)
- Ph-CH$_2$-N$^+$H$_2$-C$_4$H$_8$-NH-CH$_2$-(Si)
- Ph-CH$_2$-N$^+$H$_2$-C$_5$H$_{10}$-NH-CH$_2$-(Si)
- Ph-CH$_2$-N$^+$H$_2$-C$_6$H$_{12}$-NH-CH$_2$-(Si)
- Ph-CH$_2$-N$^+$H$_2$-C$_7$H$_{14}$-NH-CH$_2$-(Si)
- Ph-CH$_2$-N$^+$H$_2$-C$_8$H$_{16}$-NH-CH$_2$-(Si)
- Ph-CH$_2$-N$^+$H$_2$-C$_9$H$_{18}$-NH-CH$_2$-(Si)
- Ph-CH$_2$-N$^+$H$_2$-C$_{10}$H$_{20}$-NH-CH$_2$-(Si)
- Ph-CH$_2$-N$^+$H$_2$-C$_{11}$H$_{22}$-NH-CH$_2$-(Si)
- Ph-CH$_2$-N$^+$H$_2$-C$_{12}$H$_{24}$-NH-CH$_2$-(Si)

-continued

- Ph-CH$_2$-N$^+$H$_2$-C$_{13}$H$_{26}$-NH-CH$_2$-(Si)
- Ph-CH$_2$-N$^+$H$_2$-C$_{14}$H$_{28}$-NH-CH$_2$-(Si)
- Ph-CH$_2$-N$^+$H$_2$-C$_{15}$H$_{30}$-NH-CH$_2$-(Si)
- Ph-CH$_2$-N$^+$H$_2$-C$_{16}$H$_{32}$-NH-CH$_2$-(Si)
- Ph-CH$_2$-N$^+$H$_2$-C$_{17}$H$_{34}$-NH-CH$_2$-(Si)
- Ph-CH$_2$-N$^+$H$_2$-C$_{18}$H$_{36}$-NH-CH$_2$-(Si)
- Ph-CH$_2$-N$^+$H$_2$-C$_{19}$H$_{38}$-NH-CH$_2$-(Si)
- Ph-CH$_2$-N$^+$H$_2$-C$_{20}$H$_{40}$-NH-CH$_2$-(Si)
- Ph-CH$_2$-N$^+$(CH$_3$)$_2$-C$_2$H$_4$-NH-CH$_2$-(Si)
- Ph-CH$_2$-N$^+$(CH$_3$)$_2$-C$_3$H$_6$-NH-CH$_2$-(Si)
- Ph-CH$_2$-N$^+$(CH$_3$)$_2$-C$_4$H$_8$-NH-CH$_2$-(Si)
- Ph-CH$_2$-N$^+$(CH$_3$)$_2$-C$_5$H$_{10}$-NH-CH$_2$-(Si)
- Ph-CH$_2$-N$^+$(CH$_3$)$_2$-C$_6$H$_{12}$-NH-CH$_2$-(Si)
- Ph-CH$_2$-N$^+$(CH$_3$)$_2$-C$_7$H$_{14}$-NH-CH$_2$-(Si)
- Ph-CH$_2$-N$^+$(CH$_3$)$_2$-C$_8$H$_{16}$-NH-CH$_2$-(Si)
- Ph-CH$_2$-N$^+$(CH$_3$)$_2$-C$_9$H$_{18}$-NH-CH$_2$-(Si)
- Ph-CH$_2$-N$^+$(CH$_3$)$_2$-C$_{10}$H$_{20}$-NH-CH$_2$-(Si)

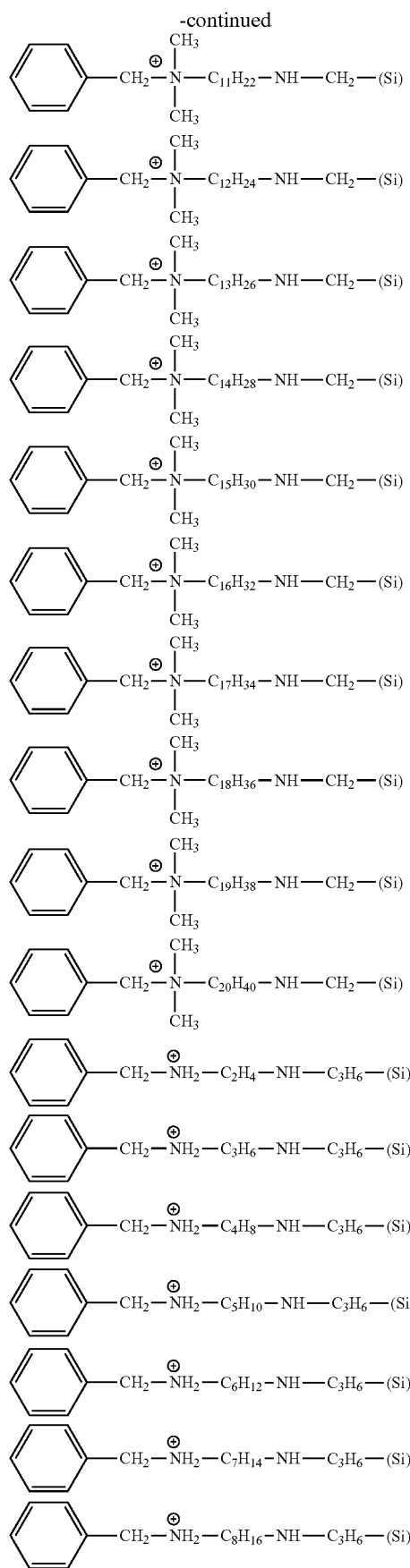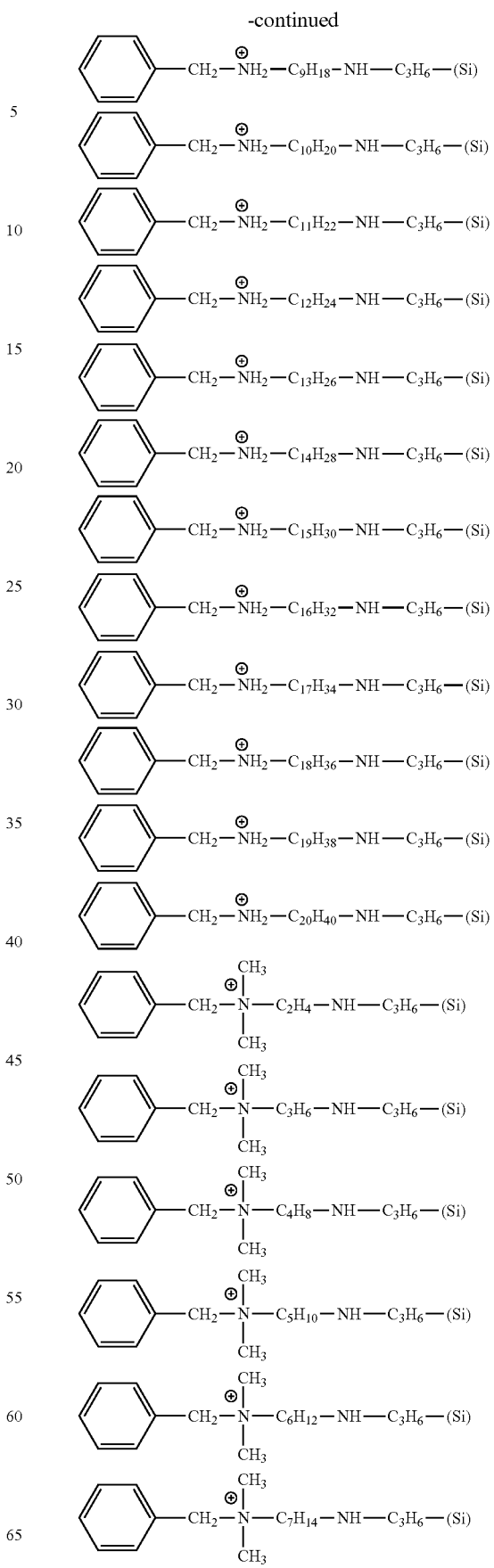

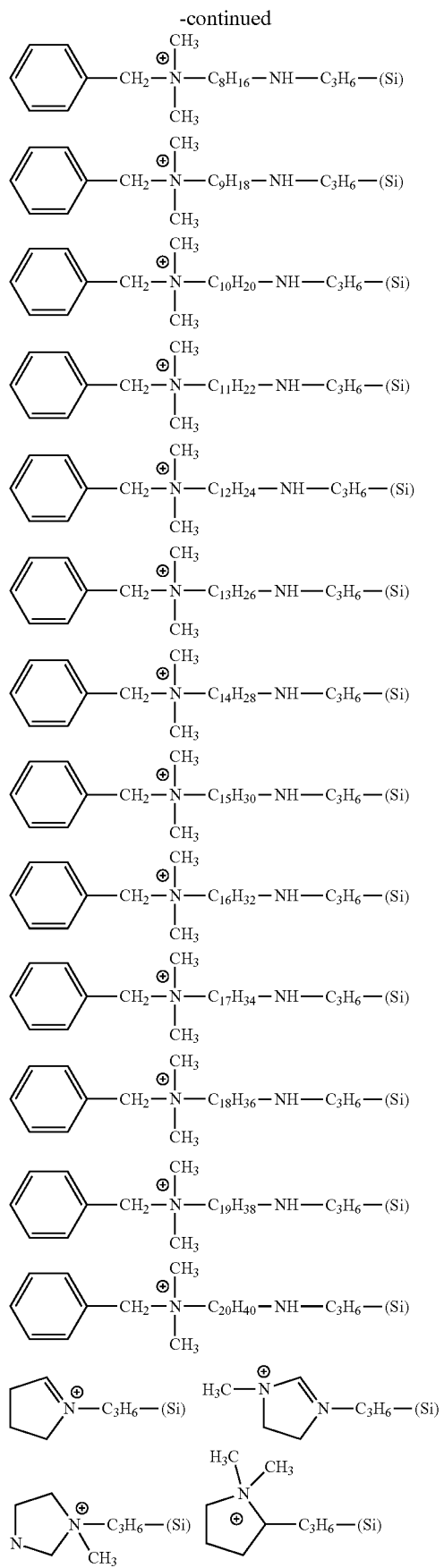
For manufacturing (Xc-10), an example of a hydrolysable silicon compound used at the same time as the above (Xm-1), (Xm-2), (Xm-3) and (Xm-4) includes the (Sm). Further, a hydrolysable metal compound shown by the following general formula (Mm) can be added.
$$U(OR^7)_{m7}(OR^8)_{m8} \quad \quad (Mm)$$

In the formula, $R^7$ and $R^8$ each represent an organic group having 1 to 30 carbon atoms; m7+m8 represents the same number as that of a valence determined by the kind of U; m7 and m8 each represent an integer of 0 or more; and U represents an element belonging to the group III, IV, or V in the periodic table, except for carbon and silicon.

Solvent (a)

The composition for forming a silicon-containing film in the present invention contains a solvent (a). An alcohol-based solvent is preferable as the solvent (a), and more preferably monoalkyl ether derivatives of ethylene glycol, diethylene glycol, triethylene glycol, propylene glycol, dipropylene glycol, butanediol, or the like. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and the like.

When these solvents are used as the main component, a non-alcohol-based solvent can also be added as an auxiliary solvent. Examples of the auxiliary solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

Water

Water may be added to the composition for forming a silicon-containing film in the present invention. When water is added, the polysiloxane compound in the composition is hydrated, so that the lithography performance is improved. The water content in the solvent component of the composition for forming a silicon-containing film in the present invention is preferably more than 0 mass % and less than 50 mass %, more preferably 0.3 to 30 mass %, further preferably 0.5 to 20 mass %. When the water content is less than 50 mass %, the uniformity of the silicon-containing resist underlayer film is favorable, and repelling does not occur.

High-Boiling-Point Solvent

Further, a high-boiling-point solvent having a boiling point of 180° C. or more can also be added to the composition for forming a silicon-containing film in the present invention as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

The solvent including water and the high-boiling-point solvent is used in a total amount of preferably 100 to 100,000 parts by mass, particularly preferably 200 to 50,000 parts by mass, based on 100 parts by mass of the thermosetting silicon-containing material (Sx).

Other Components

Organic Acid

To improve the stability of the inventive composition for forming a silicon-containing layer film, it is preferable to add a monovalent, divalent, or polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the acid to be added is preferably 0.001 to 25 parts by mass, more preferably 0.01 to 15 parts by mass, further preferably 0.1 to 5 parts by mass, based on 100 parts by mass of thermosetting silicon-containing material (Sx) contained in the composition.

Alternatively, the organic acid may be blended based on the pH of the composition so as to satisfy preferably $0 \leq pH \leq 7$, more preferably $0.3 \leq pH \leq 6.5$, further preferably $0.5 \leq pH \leq 6$.

Resin (A)

In the present invention, in order to quantify the distance of duffusion of the curing catalyst (Xc), a resin (A) which exhibits alkali-solubility by an action of an acid is used as a component of a photosensitive resin composition. The resin (A) has a property of decomposing with acid and increasing its solubility in an alkaline developer. The resin (A) is preferably a resin which has a group that may decompose with acid (hereinafter referred to as acid-decomposable group) in a main chain or a side chain or both a main chain and a side chain. In particular, a resin which has an acid-decomposable group in a side chain is more preferable. A group that is preferable as an acid-decomposable group is a group in which the hydrogen atoms in the carboxyl group or the hydroxyl group are substituted with groups that can be left with acid.

In the present invention, the acid-decomposable group is preferably an acetal group or a tertiary ester group. When these acid-decomposable groups are bonded as side chains, the skeleton structure of the resin (A) is an alkali-soluble resin which has a hydroxyl group or a carboxyl group in the side chain. For example, examples include resins containing repeating units having carboxyl group such as o-, m-, p-poly(hydroxystyrene) and copolymers thereof, styrene-hydroxystyrene copolymer, α-methylstyrene-hydroxystyrene copolymer, poly(meth)acrylic acid, poly norbornene carboxylic acid and the like, but they are not limited thereto.

Acid Generator

In the present invention, the photosensitive resin composition contains an acid generator. As the acid generator used in the present invention, there is no particular limitation, but it is possible to add, specifically, the materials described in paragraphs (0160) to (0179) of JP 2009-126940 A.

Solvent (b)

The photosensitive resin composition in the present invention contains a solvent (b). As the solvent (b), there is no particular limitation as long as each component can be dissolved. Examples of such an organic solvent include ketones such as cyclohexanone and methyl-2-n-pentyl ketone; alcohols such as 3-methoxy butanol, 3-methyl-3-methoxy butanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and mixed solvents thereof and the like.

Alkaline Developer

Examples of an alkaline developer used for developing include aqueous alkaline solutions such as sodium hydroxide, potassium hydroxide, sodium carbonate, sodium silicate, sodium metasilicate, ammonium hydroxide, tetramethylammonium hydroxide, and choline. In particular, a 0.26N tetramethylammonium hydroxide aqueous solution is preferable.

EXAMPLE

Hereinafter, the present invention will be specifically described with reference to Examples and Comparative Examples. However, the present invention is not limited to the following Examples.

Synthesis Example 1

To a mixture containing 0.9 g of 7 mass % nitric acid and 126 g of deionized water, a mixture containing 22.5 g of $CH_3Si(OCH_3)_3$ and 51.0 g of $Si(OCH_3)_4$ was added and maintained at 25° C. for 24 hours to perform hydrolysis condensation. After completion of the reaction, 850 g of propylene glycol ethyl ether (PGEE) was added thereto. Then, the water used for the hydrolysis condensation and by-produced alcohol were distilled off under reduced pressure. Thus, a solution of Polysiloxane Compound X-1 in PGEE was obtained (concentration of Compound X-1: 10 mass %). The molecular weight of the Compound X-1 was measured in terms of polystyrene and found Mw=2,200.

Compositions for forming a silicon-containing film containing the Compound X-1, curing catalyst, maleic acid, PGEE and water in each of the compositions shown in Table 1 were prepared.

TABLE 1

| | Polysiloxane (parts by mass) | Curing catalyst (parts by mass) | Maleic acid (parts by mass) | PGEE (parts by mass) | Water (parts by mass) |
|---|---|---|---|---|---|
| Soln. 1 | X-1 (1) | QMA-TFA (0.03) | (0.01) | (90) | (10) |
| Soln. 2 | X-1 (1) | QMA-NO3 (0.03) | (0.01) | (90) | (10) |
| Soln. 3 | X-1 (1) | QEA-NO3 (0.03) | (0.01) | (90) | (10) |
| Soln. 4 | X-1 (1) | QBA-NO3 (0.03) | (0.01) | (90) | (10) |
| Soln. 5 | X-1 (1) | QPA-NO3 (0.03) | (0.01) | (90) | (10) |
| Soln. 6 | X-1 (1) | TPS-NO3 (0.03) | (0.01) | (90) | (10) |
| Soln. 7 | X-1 (1) | tBu30-NO3 (0.03) | (0.01) | (90) | (10) |

Curing Catalyst

| | |
|---|---|
| QMA-TFA | tetramethylammonium trifluoroacetate |
| QMA-NO3 | tetramethylammonium nitrate |
| QEA-NO3 | tetraethylammonium nitrate |
| QBA-NO3 | tetrabutylammonium nitrate |
| QPA-NO3 | tetrapropylammonium nitrate |
| TPS-NO3 | triphenylsulfonium nitrate |
| tBu30-NO3 | t-butyltriphenylsulfonium nitrate |

Solvent

| | |
|---|---|
| PGEE | propylene glycol ethyl ether |
| PGMEA | propylene glycol monomethyl ether acetate |

A photosensitive resin composition C-1 containing 80 parts by mass of a resin (A), shown by the following structural formula, whose solubility in alkaline developer is increased by the action of an acid, 0.53 parts by mass of acid generator PAG1, shown by the following structural formula, which generates acid by a high energy beam or an electron beam, and as a solvent, 2,930 parts by mass of PGMEA and 1,450 parts by mass of ethyl lactate was prepared.

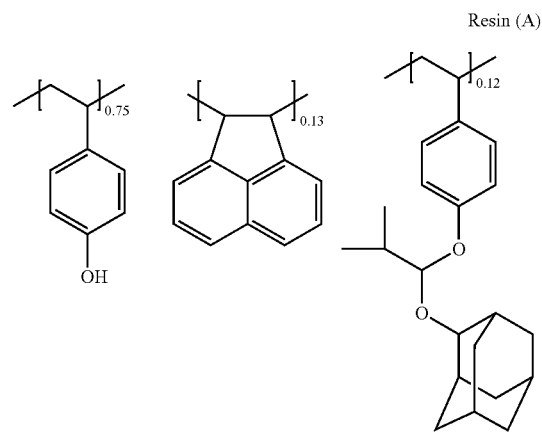

Resin (A)

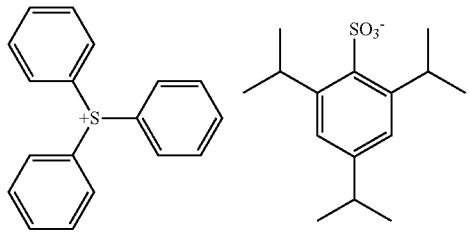

PAG1

Measurement of Distance of Diffusion of Curing Catalyst

The substrate was coated with each of the thermosetting silicon-containing composition shown in Table 1 and heated at 220° C. for 60 seconds to form a silicon-containing film with a film thickness of 20 nm. Subsequently, the silicon-containing film was coated with the photosensitive resin composition C-1 and baked at 100° C. for 60 seconds to form a resin film with a film thickness of 40 nm. Next, these were subjected to open-frame exposure with an initial dosage of 3 mJ, the number of steps as 0.75 mJ using the KrF exposure apparatus (NSR-206D, manufactured by Nikon Corporation; NA: 0.82), and after heat-treating at 150° C. for 60 seconds, were baked (PEB) at 70° C. for 60 seconds, and developed in an aqueous solution with 2.38 mass % tetramethylammonium hydroxide (TMAH) as an alkaline developer for 30 seconds. Subsequently, the film thickness of the resin (A) that was not dissolved in the alkaline developer and remained on the silicon-containing film was measured by an optical interference type film thickness measuring apparatus (VM-2200 manufactured by SCREEN Holdings Co., Ltd). The measured film thickness was set as the distance of diffusion of the curing catalyst diffused from the silicon-containing film. The film thickness of the remaining resin (A) (distance of diffusion of the curing catalyst) is shown in Table 2.

TABLE 2

| | Silicon-containing film composition | Resin film composition | Film thickness (Å) of remaining resin |
|---|---|---|---|
| Example 1 | Soln.1 | C-1 | 110.3 |
| Example 2 | Soln.2 | C-1 | 113.2 |
| Example 3 | Soln.3 | C-1 | 67.3 |
| Example 4 | Soln.4 | C-1 | 30.0 |
| Example 5 | Soln.5 | C-1 | 26.7 |
| Example 6 | Soln.6 | C-1 | 15.2 |
| Example 7 | Soln.7 | C-1 | 13.0 |

As shown in the above-described Table 2, the distance of diffusion of the curing catalyst contained in each composition for forming a silicon-containing film was measured by the method for measuring the distance of diffusion of a curing catalyst, and it was observed that the distance of diffusion was different with each curing catalyst.

As described above, the inventive method for measuring the distance of diffusion of a curing catalyst (Xc) for a silicon-containing material (Sx) makes it possible to reproduce the situation near a resist upper layer film (resin film) and a silicon-containing film (Sf) depending on the diffusion of the curing catalyst (Xc) from the silicon-containing film (Sf) without using an expensive EUV exposure apparatus, and this enables the selection of a curing catalyst (Xc) that does not affect LWR or CDU in EUV lithography.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for measuring a distance of diffusion of a curing catalyst (Xc) for a thermosetting silicon-containing material (Sx), comprising the steps of:
   (1) coating a substrate with a composition for forming a silicon-containing film containing the thermosetting silicon-containing material (Sx), the curing catalyst (Xc), and a solvent (a), and subsequently heating to form a silicon-containing film (Sf),
   (2) coating the silicon-containing film (Sf) with a photosensitive resin composition containing a resin (A), an acid generator and a solvent (b), and subsequently heating to remove the solvent (b) to prepare a substrate on which the silicon-containing film (Sf) and a resin film are formed, a solubility of the resin (A) in an alkaline developer being increased by an action of an acid, and the acid generator being to generate an acid by a high energy beam having a wavelength of 300 nm or less or an electron beam,
   (3) irradiating the substrate with the high energy beam or the electron beam to decompose the acid generator so as to generate an acid,
   (4) heat-treating the substrate to increase the solubility of the resin (A) in an alkaline developer by the action of the acid in the resin film,
   (5) dissolving in an alkaline developer the resin film having the increased solubility in the alkaline developer, and
   (6) measuring a film thickness of the resin (A) that was not dissolved in the alkaline developer and remained on the silicon-containing film (Sf),
   wherein the silicon-containing film (Sf) is formed by the thermosetting silicon-containing material (Sx) newly forming a siloxane bond by the curing catalyst (Xc).

2. The method for measuring a distance of diffusion of a curing catalyst (Xc) for a thermosetting silicon-containing material (Sx) according to claim 1, wherein a curing catalyst containing nitrogen, sulfur, phosphorus or iodine is used as the curing catalyst (Xc).

3. The method for measuring a distance of diffusion of a curing catalyst (Xc) for a thermosetting silicon-containing material (Sx) according to claim 1, wherein an onium compound is used as the curing catalyst (Xc).

4. The method for measuring a distance of diffusion of a curing catalyst (Xc) for a thermosetting silicon-containing material (Sx) according to claim 2, wherein an onium compound is used as the curing catalyst (Xc).

* * * * *